US009379713B2

(12) United States Patent
Kurokawa

(10) Patent No.: US 9,379,713 B2
(45) Date of Patent: Jun. 28, 2016

(54) DATA PROCESSING DEVICE AND DRIVING METHOD THEREOF

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/597,406

(22) Filed: Jan. 15, 2015

(65) Prior Publication Data

US 2015/0207509 A1     Jul. 23, 2015

(30) Foreign Application Priority Data

Jan. 17, 2014   (JP) .................. 2014-006354

(51) Int. Cl.
*H03K 19/177*   (2006.01)
*H03K 19/0185*   (2006.01)

(52) U.S. Cl.
CPC .. *H03K 19/17728* (2013.01); *H03K 19/018507* (2013.01); *H03K 19/1776* (2013.01)

(58) Field of Classification Search
CPC .......... H03K 19/177; H03K 19/17736; H03K 19/17728; H03K 19/17748; H03K 19/17756
USPC ...................................... 326/37–41
See application file for complete search history.

(56) References Cited

U.S. PATENT DOCUMENTS 5,731,856 A    3/1998  Kim et al.
5,744,864 A    4/1998  Cillessen et al.
5,822,755 A *  10/1998 Shippy .................. G06F 2/0897
                                                       711/118
6,097,212 A *  8/2000  Agrawal ............ H03K 19/1737
                                                        326/38
6,127,702 A    10/2000 Yamazaki et al.
6,294,274 B1   9/2001  Kawazoe et al.
6,436,741 B2   8/2002  Sato et al.

(Continued)

FOREIGN PATENT DOCUMENTS

EP    1737044 A    12/2006
EP    2226847 A     9/2010

(Continued)

OTHER PUBLICATIONS

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Don Le
(74) *Attorney, Agent, or Firm* — Fish & Richardson P.C.

(57) ABSTRACT

In a processor or the like including a reconfigurable (RC) circuit, the RC circuit is used to form a test circuit to test a core, a cache memory, or the like, and then part of the RC circuit is used as an auxiliary cache memory. When a memory can store data after stop of power supply, a startup routine program (SRP) of the processor can be stored therein. For example, after the test, an SRP is loaded to a memory in the RC circuit from an external ROM or the like, and when power is resupplied to the processor, a startup operation is performed using the loaded SRP. When the processor is in a normal operation state, this memory is used as an auxiliary cache memory and the SRP is overwritten. The SRP is loaded to the memory again at the end of use of the processor.

18 Claims, 25 Drawing Sheets

(56) References Cited

U.S. PATENT DOCUMENTS

| | | | |
|---|---|---|---|
| 6,563,174 B2 | 5/2003 | Kawasaki et al. | |
| 6,601,218 B2 | 7/2003 | Sato et al. | |
| 6,615,402 B2 | 9/2003 | Kaneko et al. | |
| 6,678,645 B1 | 1/2004 | Rajsuman et al. | |
| 6,727,522 B1 | 4/2004 | Kawasaki et al. | |
| 6,874,107 B2 | 3/2005 | Lesea | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,245,134 B2 | 7/2007 | Granicher et al. | |
| 7,256,613 B1* | 8/2007 | Sharpe-Geisler | H03K 19/17728 326/39 |
| 7,282,782 B2 | 10/2007 | Hoffman et al. | |
| 7,297,977 B2 | 11/2007 | Hoffman et al. | |
| 7,307,433 B2 | 12/2007 | Miller et al. | |
| 7,323,356 B2 | 1/2008 | Hosono et al. | |
| 7,342,414 B2* | 3/2008 | DeHon | H04L 45/26 326/37 |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,547,753 B2 | 10/2013 | Takemura et al. | |
| 8,581,610 B2 | 11/2013 | Miller et al. | |
| 8,675,382 B2 | 3/2014 | Kurokawa | |
| 9,065,438 B2 | 6/2015 | Aoki et al. | |
| 2001/0046027 A1 | 11/2001 | Tai et al. | |
| 2002/0010886 A1 | 1/2002 | Tanaka et al. | |
| 2002/0056838 A1 | 5/2002 | Ogawa | |
| 2002/0132454 A1 | 9/2002 | Ohtsu et al. | |
| 2003/0080776 A1* | 5/2003 | Kohno | G06F 17/5054 326/39 |
| 2003/0097510 A1 | 5/2003 | Joseph | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0030056 A1 | 2/2005 | Woo et al. | |
| 2005/0121789 A1* | 6/2005 | Madurawe | H01L 27/0207 257/758 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0279087 A1* | 12/2007 | Imafuku | H03K 19/17732 326/38 |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2012/0212995 A1 | 8/2012 | Kurokawa | |
| 2012/0293206 A1* | 11/2012 | Yoneda | H03K 19/17736 326/101 |
| 2013/0207170 A1 | 8/2013 | Kurokawa | |
| 2013/0285697 A1 | 10/2013 | Kurokawa | |
| 2013/0286757 A1 | 10/2013 | Takemura | |
| 2013/0293266 A1* | 11/2013 | Takemura | H03K 19/094 326/102 |
| 2013/0314124 A1* | 11/2013 | Ikeda | H03K 19/177 326/41 |
| 2013/0321025 A1 | 12/2013 | Kurokawa et al. | |
| 2015/0123684 A1 | 5/2015 | Kurokawa | |
| 2015/0123704 A1 | 5/2015 | Kurokawa | |
| 2015/0131356 A1 | 5/2015 | Kurokawa | |
| 2015/0144948 A1 | 5/2015 | Kurokawa | |
| 2015/0192641 A1 | 7/2015 | Kurokawa | |
| 2015/0226791 A1 | 8/2015 | Kurokawa | |
| 2015/0226793 A1 | 8/2015 | Kurokawa | |
| 2015/0226802 A1 | 8/2015 | Kurokawa | |
| 2015/0227378 A1 | 8/2015 | Kurokawa | |
| 2015/0227379 A1 | 8/2015 | Kurokawa | |
| 2015/0229309 A1 | 8/2015 | Kurokawa | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-142297 A | 6/1993 |
| JP | 05-251705 A | 9/1993 |
| JP | 08-264794 A | 10/1996 |
| JP | 11-505377 | 5/1999 |
| JP | 2000-044236 A | 2/2000 |

(56) References Cited

FOREIGN PATENT DOCUMENTS

| JP | 2000-150900 A | 5/2000 |
|---|---|---|
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO00/62339 | 10/2000 |
| WO | WO-2004/114391 | 12/2004 |

OTHER PUBLICATIONS

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transistion:The "Blue Phase"", Physics Letters, Sep. 10, 1973. vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Techncial Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, andYb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings Of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layers", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

\* cited by examiner

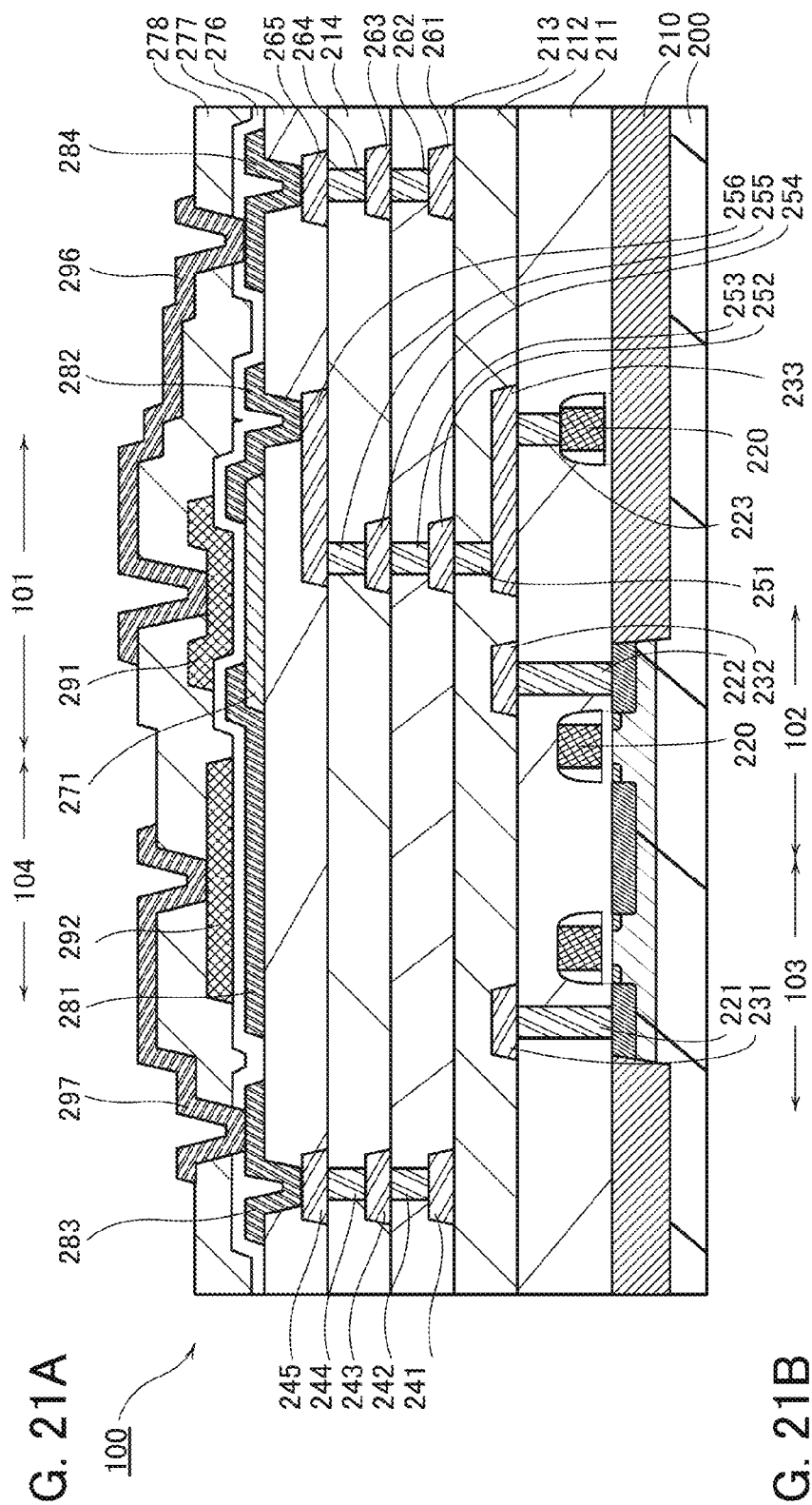
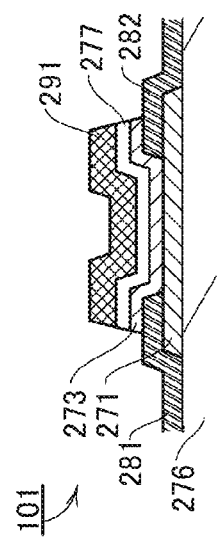
FIG. 21A
FIG. 21B

FIG. 23A
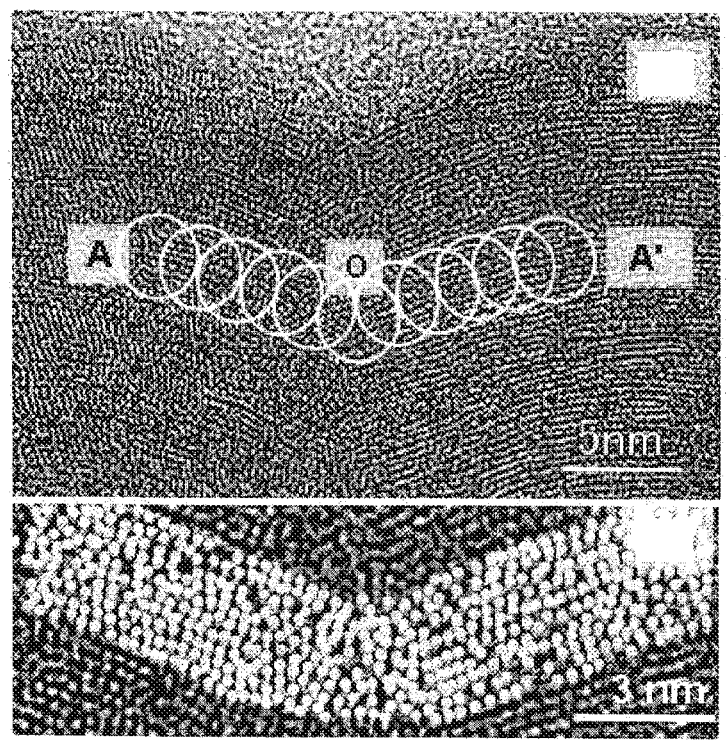
FIG. 23B
FIG. 23C
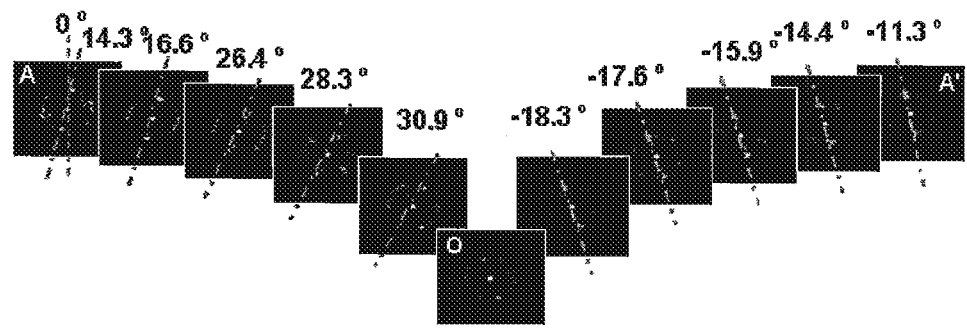

CAAC-OS nc-OS as-sputtered

After heat treatment at 450°C

DATA PROCESSING DEVICE AND DRIVING METHOD THEREOF

BACKGROUND OF THE INVENTION

1. Field of the Invention

One embodiment of the present invention relates to a data processing device.

2. Description of the Related Art

As a type of semiconductor integrated circuit, a configurable circuit whose circuit function can be changed once or multiple times by programming by a user after shipment is known. Examples of such a configurable circuit are small-scale logics such as a programmable array logic (PAL) and a generic array logic (GAL) and large-scale logics such as a complex programmable logic device (CPLD) and a field programmable gate array (FPGA). Note that a configurable circuit is sometimes called a configurable device or the like and is also a programmable circuit. A circuit whose circuit function can be changed once or multiple times is particularly referred to as a reconfigurable circuit.

One reconfigurable circuit can be used for multiple purposes by rewriting configuration data stored in a configuration memory or changing configuration data read from the configuration memory.

For example, Patent Document 1 discloses an FPGA that is included in a semiconductor chip and used for a tester testing a CPU, an SRAM, and a DRAM in the semiconductor chip.

Note that a semiconductor used in such a reconfigurable circuit is not limited to silicon. Examples using an oxide semiconductor are disclosed in Patent Documents 2 and 3, for example.

REFERENCE

Patent Document

[Patent Document 1] PCT International Publication No. WO 00/62339
[Patent Document 2] U.S. Pat. No. 8,547,753
[Patent Document 3] U.S. Pat. No. 8,675,382

SUMMARY OF THE INVENTION

An object is to provide a reconfigurable circuit which can also be used as a memory and a driving method thereof. Another object is to provide a memory or a data processing device whose operation time can be shortened and a driving method thereof. Another object is to provide a memory or a data processing device which includes a test circuit and can be manufactured at low cost, and a driving method thereof. Another object is to provide a novel data processing device and a driving method thereof. In addition to the above objects, one or a plurality of objects can be derived from the descriptions of the specification, the drawings, the claims, and the like.

A data processing device includes first to third switch array matrixes and a logic circuit. Each of the first to third switch array matrixes includes a programmable switch at an intersection of a matrix formed using a first wiring group and a second wiring group. The programmable switch can make an electrical connection or disconnection between one wiring of the first wiring group and one wiring of the second wiring group. Signals of a plurality of wirings of the second wiring group in the second switch array matrix are input to the logic circuit. An output of the logic circuit is input to one wiring of the first wiring group in the first switch array matrix through a first switch, input to one wiring of the first wiring group in the second switch array matrix through a second switch, and input to one wiring of the first wiring group in the third switch array matrix through a third switch.

At least one of the above-described objects can be achieved.

BRIEF DESCRIPTION OF THE DRAWINGS

In the accompanying drawings:

FIGS. 21A and 21B illustrate examples of a cross-sectional structure of a data processing device;
FIGS. 23A to 23C illustrate an example of a structure of an oxide semiconductor.

DETAILED DESCRIPTION OF THE INVENTION

Figure 1:
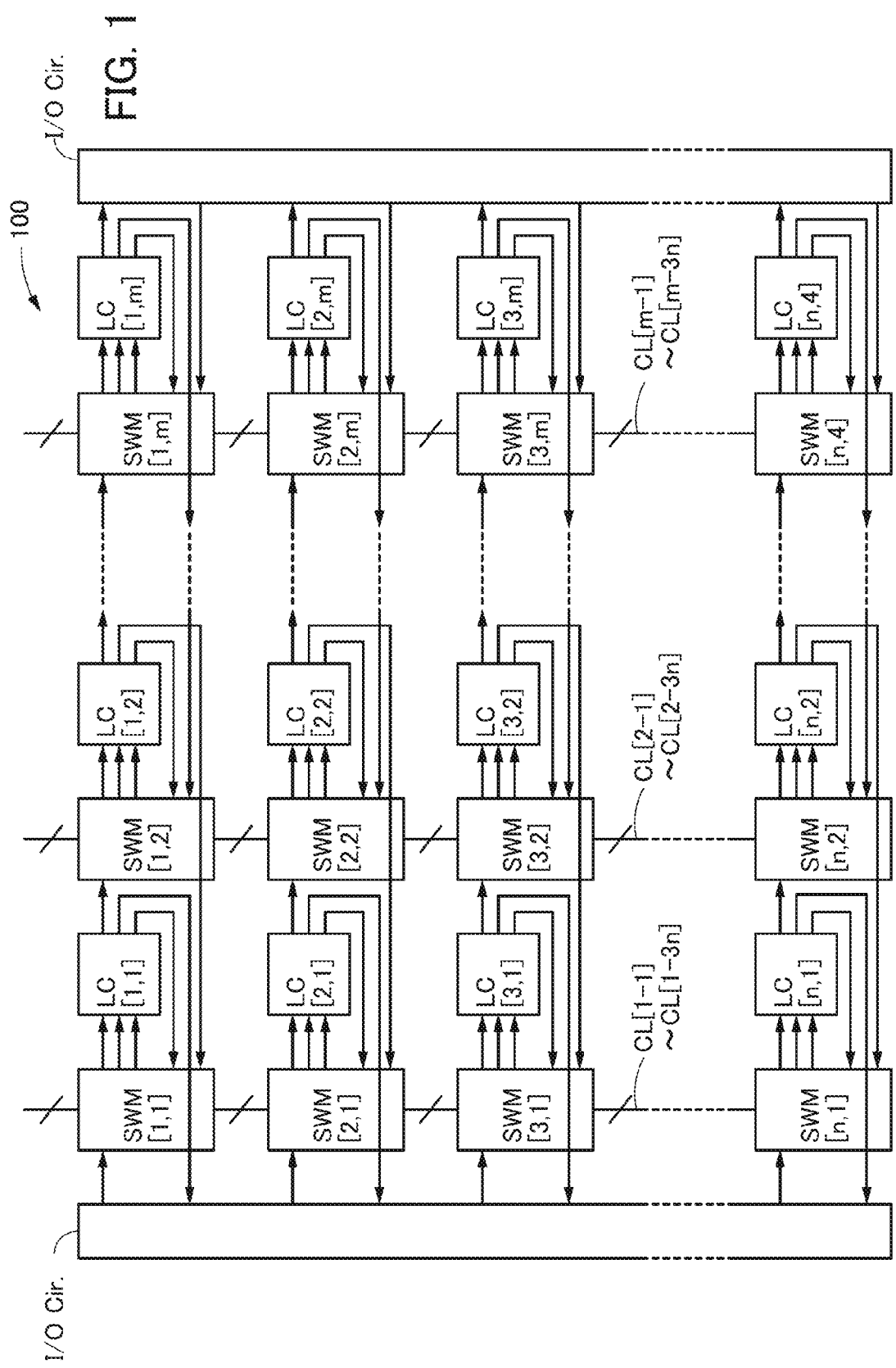
FIG. 1 illustrates a structural example of a data processing device.

Hereinafter, embodiments of the present invention will be described in detail with reference to the accompanying drawings. Note that the present invention is not limited to the description below, and it is easily understood by those skilled in the art that a variety of modifications can be made to the modes and details without departing from the spirit and scope of the present invention. Therefore, the present invention should not be construed as being limited to the following description of the embodiments. One or more of the following embodiments can be implemented in combination with one or more of the other embodiments as appropriate.

Note that in the following embodiments, the same portions or portions having similar functions are denoted by the same reference numerals in different drawings, and explanation thereof will not be repeated. Furthermore, a high ("H") signal and a low ("L") signal can be reversed depending on the circuit configuration. In addition, an "H" (or "L") signal has a potential, voltage, or the like different from another "H" (or "L") signal depending on a wiring and a transistor in some cases. In other words, a potential "H" (or "L") of a signal line is different from a potential "H" (or "L") of another signal line in some cases.

In the following embodiments, the term "matrix" may be expressed as an array of rows and columns intersecting at right angles; however, it may practically be an array of rows and columns intersecting at angles that are not right angles.

In the following embodiments, a transistor can be replaced with an electrical or mechanical switch or switching element having an equivalent function.

(Embodiment 1)

FIG. 1 illustrates a data processing device 100. In the data processing device 100, a plurality of switch array matrixes SWM and a plurality of logic circuits LC are provided in a matrix and are electrically connected to or disconnected from each other, thereby constituting a circuit (reconfigurable circuit). For example, in the data processing device 100 in FIG. 1, three signals are input from a switch array matrix SWM to an adjacent logic circuit LC. Note that the number of signals input to the logic circuit LC is not limited to 3 and may be 2, or 4 or more.

For example, three signals are output from the logic circuit LC to be input to three different switch array matrixes SWM in the same row. The three signals are the same signals, which is to be described later. Note that it is possible not to input one or more of the three signals to a corresponding switch array matrix SWM depending on the configuration of the logic circuit LC.

A signal from a wiring CL is also input to the switch array matrix SWM. For example, in FIG. 1, 3n wirings (wirings CL[1-1] to CL[1-3n]) pass through a switch array matrix SWM[1,1]; however, it is not limited thereto.

An input/output circuit (I/O circuit) is provided at each end of such a matrix of the switch array matrixes SWM and the logic circuits LC, from which a signal is output to the switch array matrixes SWM or to which a signal is input from the logic circuits LC.

Figure 2:
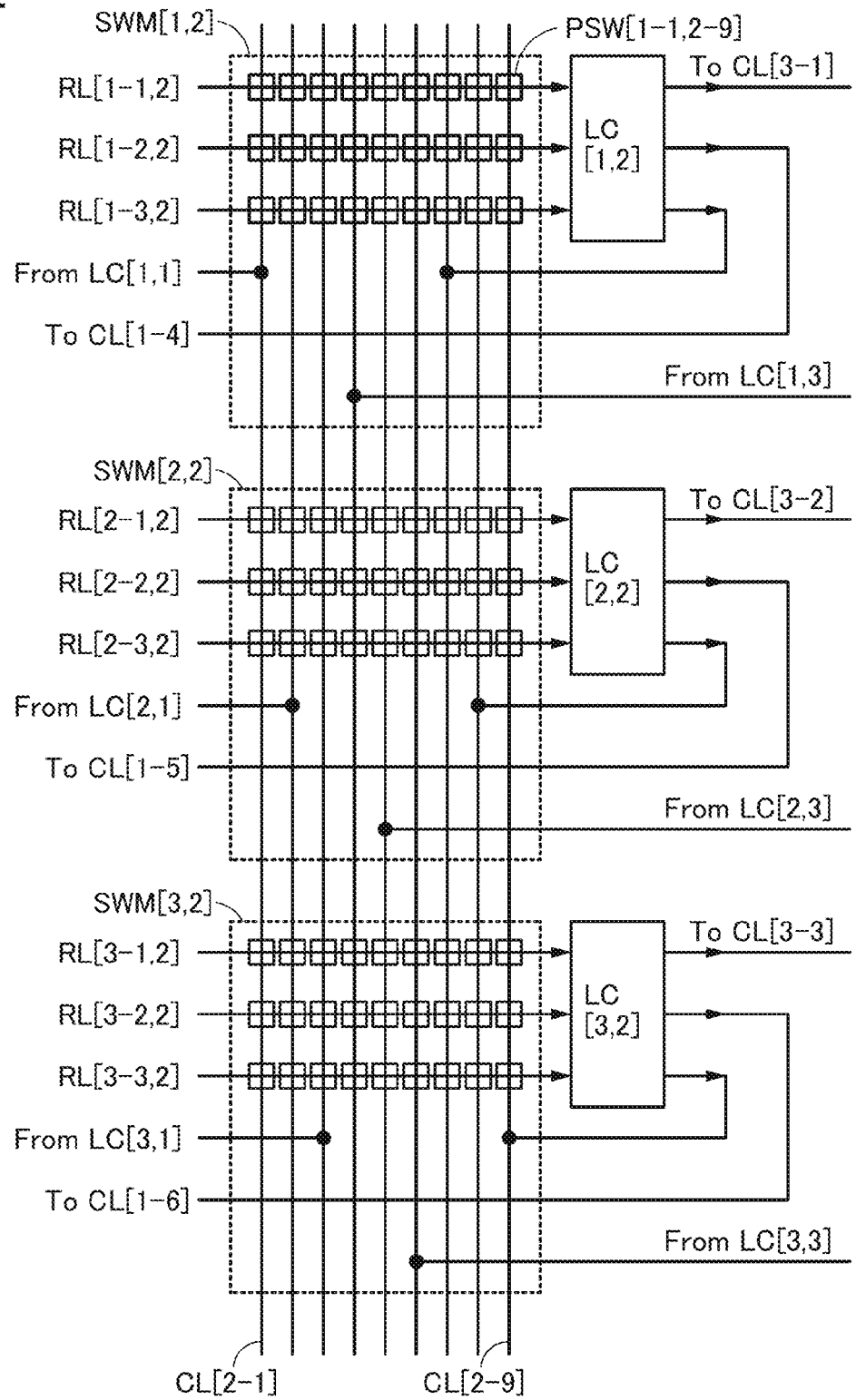
FIG. 2 illustrates a structural example of a data processing device.

FIG. 2 illustrates a smaller-scale data processing device. Here, the number of logic circuits in a column direction in FIG. 1 is 3 as an example. FIG. 2 illustrates a switch array matrix SWM[1, 2], a switch array matrix SWM[2, 2], a switch array matrix SWM[3, 2], a logic circuit LC[1, 2], a logic circuit LC[2, 2], a logic circuit LC[3, 2], and other circuit components related to the switch array matrixes SWM and the logic circuits LC.

In the switch array matrix SWM[1, 2], wirings CL[2-1] to CL[2-9] and wirings RL[1-1, 2] to RL[1-3, 2] intersect with one another in a matrix, and a programmable switch PSW is provided at each intersection. For example, a programmable switch PSW[1-1, 2-9] is provided at an intersection of the wiring CL[2-9] and the wiring RL[1-1, 2]. Here, a programmable switch PSW has a function of controlling a connection and disconnection between intersecting wiring RL and wiring CL. For example, the programmable switch PSW[1-1, 2-9] can control a connection and disconnection between the wiring CL[2-9] and the wiring RL[1-1, 2].

In the following description, the phrase "a programmable switch PSW is on" means that a wiring RL and a wiring CL which pass through a programmable switch PSW are electrically connected (in a conduction state) through the programmable switch PSW; and the phrase "a programmable switch PSW is off" means that a wiring RL and a wiring CL which pass through a programmable switch PSW are not connected through the programmable switch PSW. In this manner, a wiring RL and a wiring CL can be electrically connected or disconnected through a programmable switch PSW.

In the switch array matrix SWM[1, 2], 27 programmable switches PSW are provided. Each of the switch array matrixes SWM[2, 2] and SWM[3, 2] also includes 27 programmable switches PSW.

A signal from a wiring RL is input to a logic circuit LC. For example, when the programmable switch PSW[1-1, 2-9] is on, a signal transmitted through the wiring CL[2-9] is input to the logic circuit LC[1, 2] through the wiring RL[1-1, 2].

Three signals are seemingly output from the logic circuit LC[1, 2]. As described above, the three signals are derived from one signal. One of the three signals is input to the switch array matrix SWM[1, 2], strictly, to the wiring CL[2-7] passing through the switch array matrix SWM[1, 2]. Another one of the three signals is input to the switch array matrix SWM[1, 1], strictly, to the wiring CL[1-4] passing through the switch array matrix SWM[1, 1]. The other of the three signals is input to a switch array matrix SWM[1, 3], strictly to a wiring CL[3-1] passing through the switch array matrix SWM[1, 3].

Next, examples of the programmable switch PSW are described with reference to FIGS. 3A and 3B and FIG. 4. The programmable switch PSW[1-1, 2-9] in FIGS. 3A and 3B and FIG. 4 includes a transistor 101 (or transistors 101a to 101c); a transistor 102 (or transistors 102a to 102c); a transistor 103 (or transistors 103a to 103c); and a capacitor 104 (or capacitors 104a to 104c). Note that the capacitor 104 (or the capacitors 104a to 104c) may be intentionally omitted. In the description below, all the transistors are n-channel transistors; however, some or all of the transistors may be p-channel transistors. A transmission gate may be used instead of the transistor 103.

When the transistor 101 (or each of the transistors 101a to 101c) is a transistor including an oxide semiconductor and having extremely small off-state current (see Patent Documents 2 and 3), leakage of charge accumulated in the capacitor 104 (or the capacitors 104a to 104c) or a gate of the transistor 102 (or gates of the transistors 102a to 102c) can be suppressed and a potential of the gate of the transistor 102 (or potentials of the gates of the transistors 102a to 102c) can be retained for a sufficiently long time even after power supply is stopped.

Accordingly, as is to be described later, in the case of being used as a memory storing data by on and off states of the transistor 102 (or the transistors 102a to 102c), the programmable switch PSW can be used as a substantially nonvolatile memory which can retain data even after power supply is stopped when a transistor including an oxide semiconductor is used.

Figure 3A:
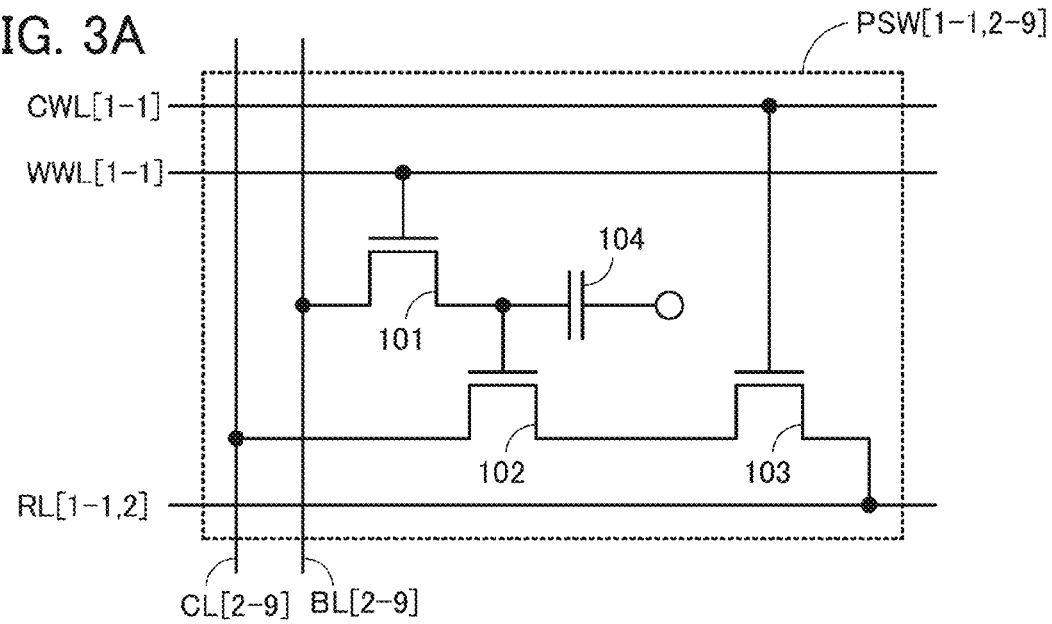
FIGS. 3A and 3B illustrate structural examples of a data processing device.

For example, in the programmable switch PSW[1-1, 2-9] in FIG. 3A, a gate of the transistor 101 is connected to a wiring WWL[1-1], one of a source and a drain of the transistor 101 is connected to a wiring BL[2-9], and the other thereof is connected to the gate of the transistor 102. A gate of the transistor 103 is connected to a wiring CWL[1-1] and one of a source and a drain of the transistor 103 is connected to the wiring RL[1-1, 2]. One of a source and a drain of the transistor 102 is connected to the wiring CL[2-9] and the other thereof is connected to the other of the source and the drain of the transistor 103. One electrode of the capacitor 104 is connected to the gate of the transistor 102.

Note that in order to retain charge accumulated in the capacitor 104 for a longer time, the one electrode of the capacitor 104 may be designed to be disconnected permanently (constantly) from all the wirings and nodes except for the other of the source and the drain of the transistor 101.

These connection relations are only examples; an element or a circuit having a switching function, a signal inversion function, an amplification function, or the like may be provided between a wiring and an element or between wirings. In other words, a wiring, or a gate, a source, a drain, an electrode, or the like of an element may be connected to another wiring, or a gate, a source, a drain, an electrode, or the like of another element through an element or a circuit, or may be directly connected without such an element or a circuit.

For example, the circuit structure of the programmable switch PSW[1-1, 2-9] in FIG. 3A can also be described as follows: the gate of the transistor 101 is connected to the wiring WWL[1-1]; the gate of the transistor 103 is connected to the wiring CWL[1-1]; the source and the drain (or the source, a channel, and the drain) of the transistor 101 are provided between the wiring BL[2-9] and the gate of the transistor 102; and the source and the drain of the transistor 102 and the source and the drain of the transistor 103 are provided between the wiring RL[1-1, 2] and the wiring CL[2-9].

Note that in the case where a transistor is provided between two nodes and a source and a drain of the transistor can be distinguished from each other, for example, it can also be said that the source, a channel, and the drain are provided in this order between the two nodes.

The programmable switch PSW[1-1, 2-9] in FIG. 3A is turned on when both the transistor 102 and the transistor 103 are on. The transistor 103 is turned on by controlling a potential of the wiring CWL. The transistor 102 is turned on by keeping its gate potential at an appropriate value.

As an example, the potential of the wiring BL[2-9] may be set to an appropriate value while the transistor 101 is on. Note that the transistor 101 can be turned on by setting a potential of the wiring WWL[1-1] to an appropriate value.

At this time, for example, a potential of the wiring CL[2-9] is lower than the potential of the wiring BL[2-9]. For example, in the case where the transistor 102 is turned on with a gate potential of "H" and a source potential of "L", the potential of the wiring BL[2-9] is set to "H" (or higher) and the potential of the wiring CL[2-9] is set to "L" (or lower).

After that, the transistor 101 is turned off. The potential of the gate of the transistor 102 can be held at a level which is required to keep the transistor 102 on for a certain period as long as the gate of the transistor 102 is sufficiently insulated from another wiring or circuit. Such an operation is referred to as programming of a programmable switch PSW. In addition, such a state is described as "a programmable switch PSW is programmed to be on".

In the case of programming under the above condition, after that, the potential of the gate of the transistor 102 becomes higher than the potential of the wiring BL[2-9] in programming in some cases when the potential of the wiring CL[2-9] becomes higher than "L" (boosting effect). The boosting effect is a phenomenon in which due to capacitive coupling between a channel and a gate of the transistor 102 which is in an on state, a potential of the gate thereof increases. The boosting effect becomes noticeable as the capacitance of the gate of the transistor 102 (including the capacitor 104 but excluding channel capacitance, capacitance between the gate and the source or between the gate and the drain) is smaller. Increase in the potential of the gate of the transistor 102 due to the boosting effect is preferable in terms of lowering the on-state resistance of the transistor 102.

In order that the transistor 102 is turned off, the potential of the wiring BL[2-9] is set to, for example, "L" (or lower) with the transistor 101 on. Such a state is described as "a programmable switch PSW is programmed to be off".

Figure 3B:
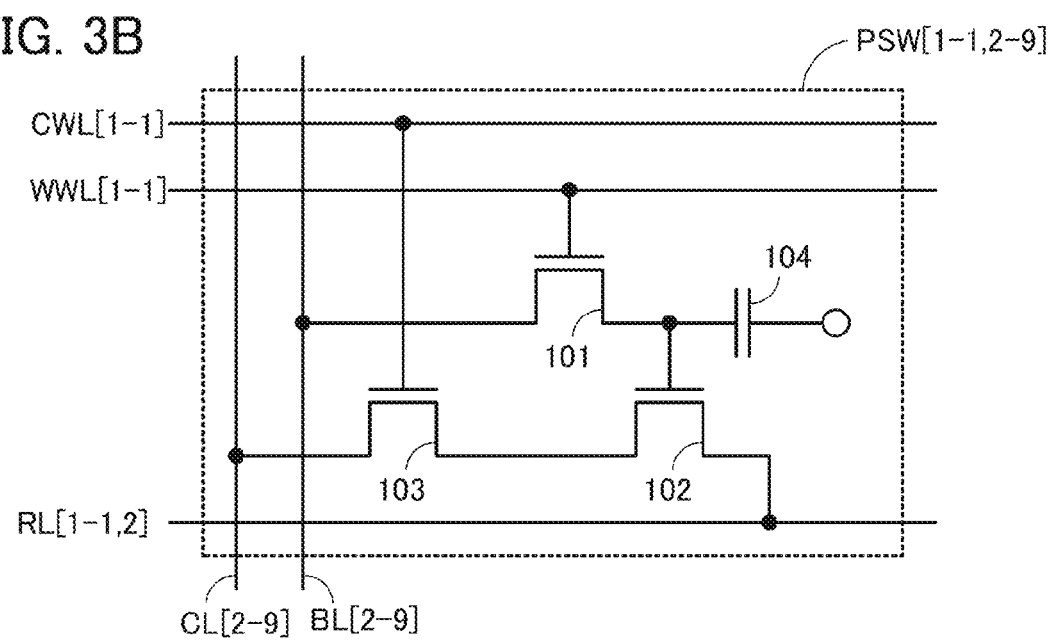

The difference between the programmable switch PSW[1-1, 2-9] in FIG. 3B and that in FIG. 3A is a connection relation between the transistor 102 and the transistor 103. In other words, in FIG. 3B, one of the source and the drain of the transistor 102 is connected to the wiring RL[1-1, 2] and one of the source and the drain of the transistor 103 is connected to the wiring CL[2-9]. The programmable switch PSW[1-1, 2-9] in FIG. 3B and that in FIG. 3A are similar in that the reading transistor 102 and the transistor 103 are connected in series between the wiring RL[1-1, 2] and the wiring CL[2-9].

In order that the boosting effect is obtained in the programmable switch PSW[1-1, 2-9] in FIG. 3B, a potential of the wiring RL[1-1, 2] may be set to "L" (or lower) in programming. Alternatively, the potential of the wiring CL[2-9] may be set to "L" (or lower) with the transistor 103 on.

Figure 4:
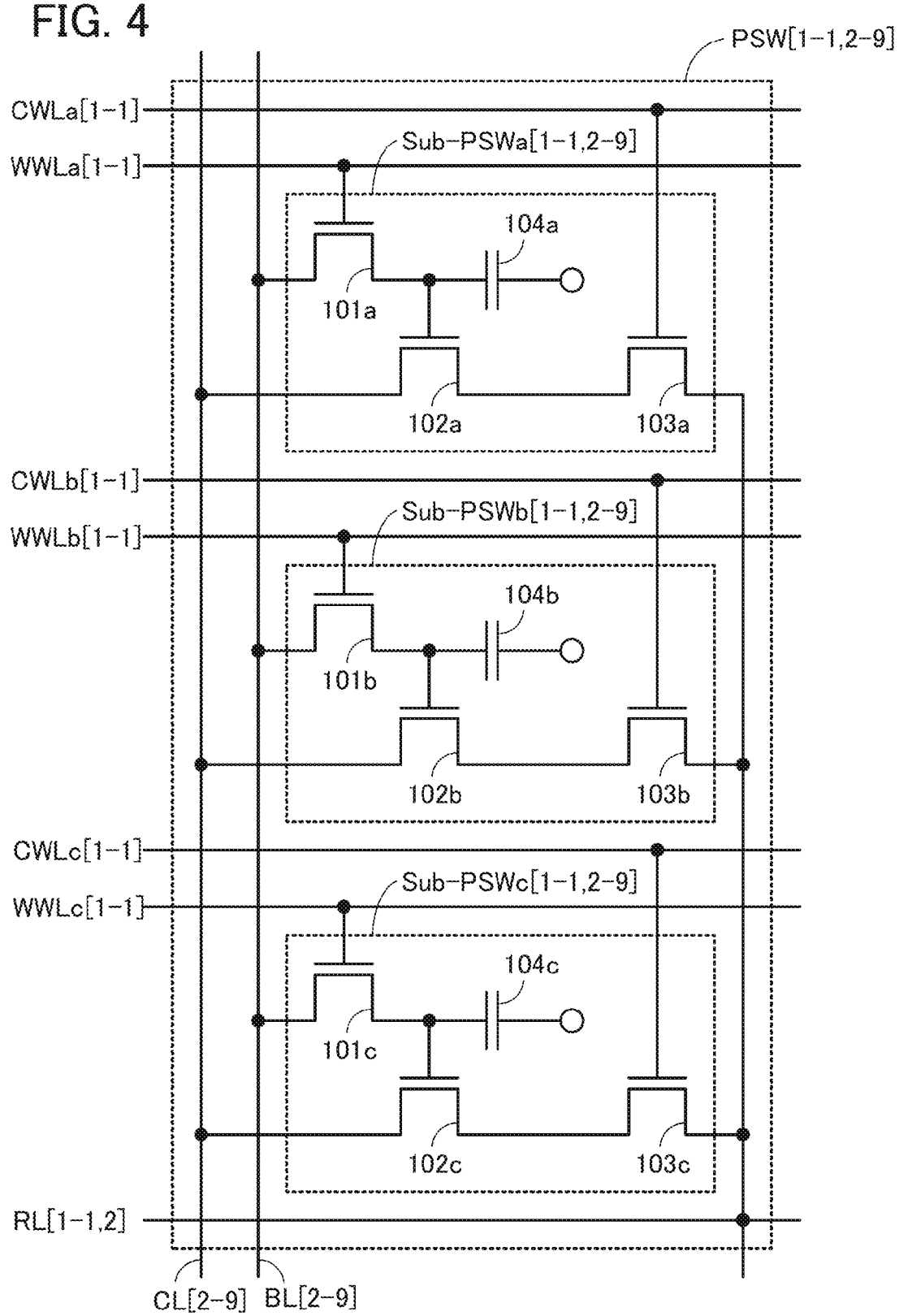
FIG. 4 illustrates a structural example of a data processing device.

The programmable switch PSW[1-1, 2-9] in FIG. 4 includes three circuits similar to that in FIG. 3A, i.e., includes a sub-programmable switch Sub-PSWa[1-1, 2-9], a sub-programmable switch Sub-PSWb[1-1, 2-9], and a sub-programmable switch Sub-PSWc[1-1, 2-9]. Needless to say, circuits similar to that in FIG. 3B may be used.

These sub-programmable switches control a connection between the wiring CL[2-9] and the wiring RL[1-1, 2]. One of the transistors 103a to 103c is turned on by control of potentials of wirings CWLa[1-1], CWLb[1-1], and CWLc[1-1], whereby at most three patterns which are composed of a plurality of the programmable switches PSW including the programmable switch PSW [1-1, 2-9] can be switched in a short time.

On and off states of the transistors 101a to 101c can be controlled by wirings WWLa, WWLb, and WWLc.

Figure 5A:
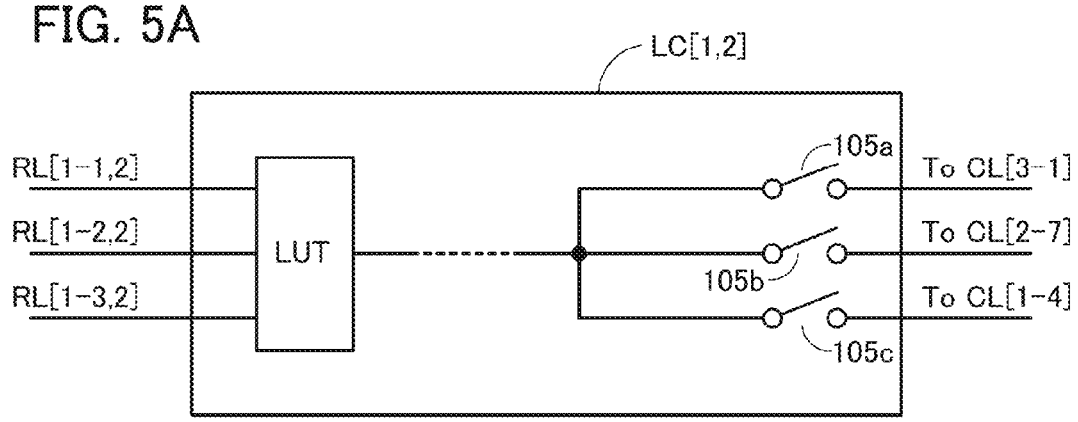
FIGS. 5A to 5C illustrate structural examples of a data processing device.

FIG. 5A illustrates a structural example of the logic circuit LC[1, 2]. Signals of the wirings RL[1-1, 2], RL[1-2, 2], and RL[1-3, 2] are input to the logic circuit LC[1, 2]. The signals of these wirings are directly or indirectly input to a lookup table LUT. An output of the lookup table LUT is directly or indirectly input to the wirings CL[1-4], CL[2-7], and CL[3-1]. Switches 105a, 105b, and 105c are provided between an output of the lookup table LUT and the wirings CL[1-4], CL[2-7], and CL[3-1].

A single transistor, an analog switch, a transmission gate, a tri-state buffer, or the like can be used for each of the switches 105a to 105c. Alternatively, the programmable switch PSW in FIG. 3A or 3B can be used. For example, a programmable switch having a structure in which the transistor 103 is omitted from the structure in FIG. 3A may be used.

Figure 6C:
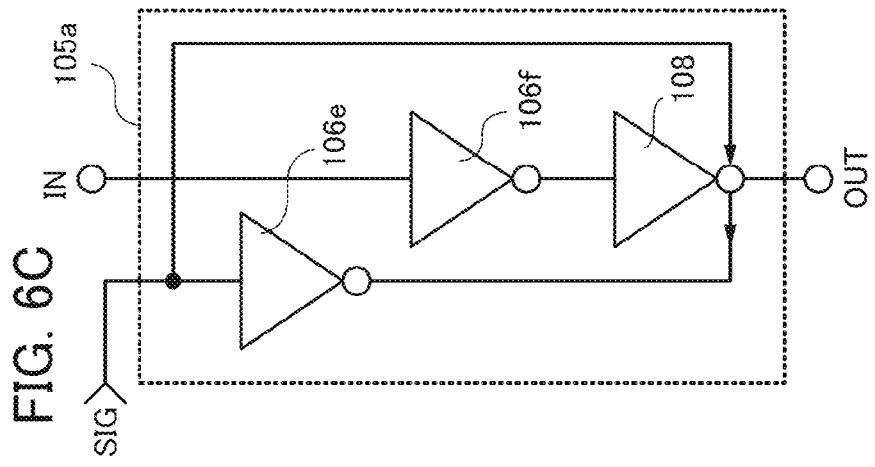
FIGS. 6A to 6C illustrate structural examples of a data processing device.
Figure 6B:
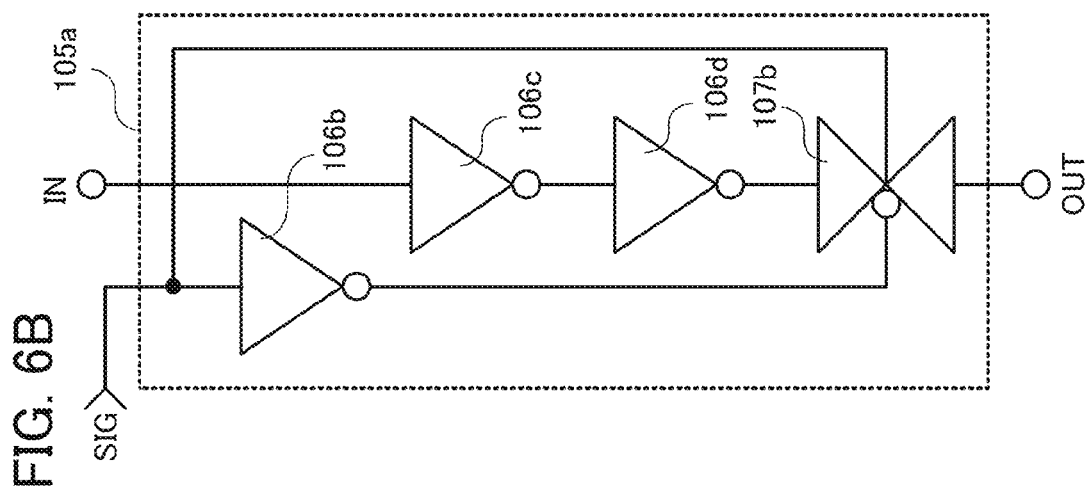
Figure 6A:
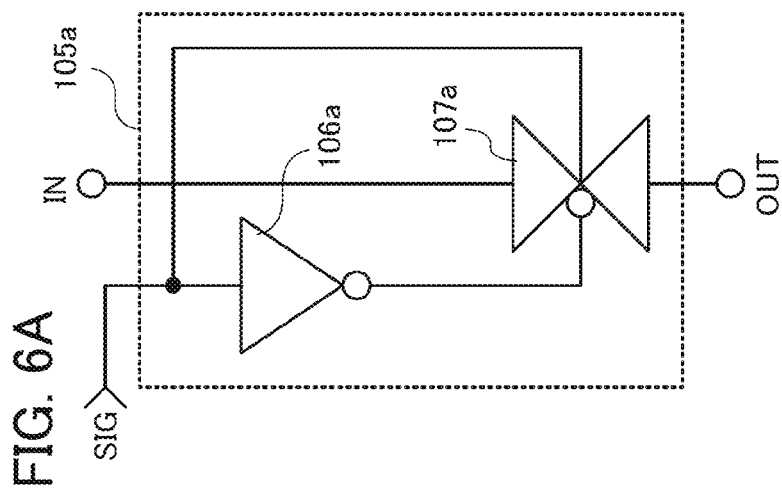

FIG. 6A illustrates a circuit example of the switch 105a including an inverter 106a and a transmission gate 107a. In the switch 105a in FIG. 6A, conduction between an input IN and an output OUT is controlled by a signal SIG for controlling on and off states of the switch 105a. Note that the inverter 106a generates an inversion signal of the signal SIG which is to be input to the transmission gate 107a, and may be omitted when the inversion signal can be obtained in a different way.

FIG. 6B illustrates a circuit example of the switch 105a including inverters 106b to 106d and a transmission gate

107b. In this circuit, the inverters 106c and 106d are added to the circuit in FIG. 6A to amplify a signal of the input IN which is to be input to the transmission gate 107b. Note that a plurality of inverters may be additionally provided between the input IN and the output OUT.

FIG. 6C illustrates a circuit example of the switch 105a including an inverter 106e, an inverter 106f, and a clocked inverter 108. In this circuit, the clocked inverter 108 functions as the inverter 106d and the transmission gate 107b in FIG. 6B. Three kinds of signals, i.e., "H", "L", and a high impedance state can be obtained from the clocked inverter 108. The power consumption of a clocked inverter is generally lower than that of an inverter. The inverter 106f may be replaced with a clocked inverter. In addition, one or both of the inverters 106c and 106d in FIG. 6B may be replaced with a clocked inverter. Furthermore, a plurality of inverters (or clocked inverters) may be additionally provided between the input IN and the clocked inverter 108.

Although a signal of the output OUT is not inverted in the above examples, one of the inverters 106c and 106d in FIG. 6B and the inverter 106f in FIG. 6C may be omitted if the signal of the output OUT may be inverted. Alternatively, an odd number of inverters may be added.

The logic circuit LC outputs a signal corresponding to a signal of the wiring RL. An output pattern of the logic circuit LC can be changed by changing data (configuration data) stored in a memory provided in the logic circuit LC, typically in the lookup table LUT. Configuration data of the logic circuit LC may be changed in such a way that data is supplied from the outside each time or that one of a plurality of sets of data stored in the logic circuit LC in advance is used as appropriate. Note that in the case of a drive mode described later, data is preferably written also in a memory in the logic circuit LC concurrently with an operation of [Data writing] described later.

The switches 105a to 105c may be set to be turned on or off simultaneously or independently. Alternatively, two of the switches 105a to 105c may be set to be turned on or off simultaneously and the remaining one of the switches 105a to 105c may be turned on or off independently. In the case where the switches 105a to 105c are set to be turned on or off independently, for example, only the switch 105c is off and the others are on, whereby an output of the logic circuit LC[1, 2] is not transmitted to the wiring CL[1-4] and accordingly not to the logic circuit LC[1, 1]. Therefore, a load can be reduced when the logic circuit LC[1, 1] is not used.

Figure 5B:
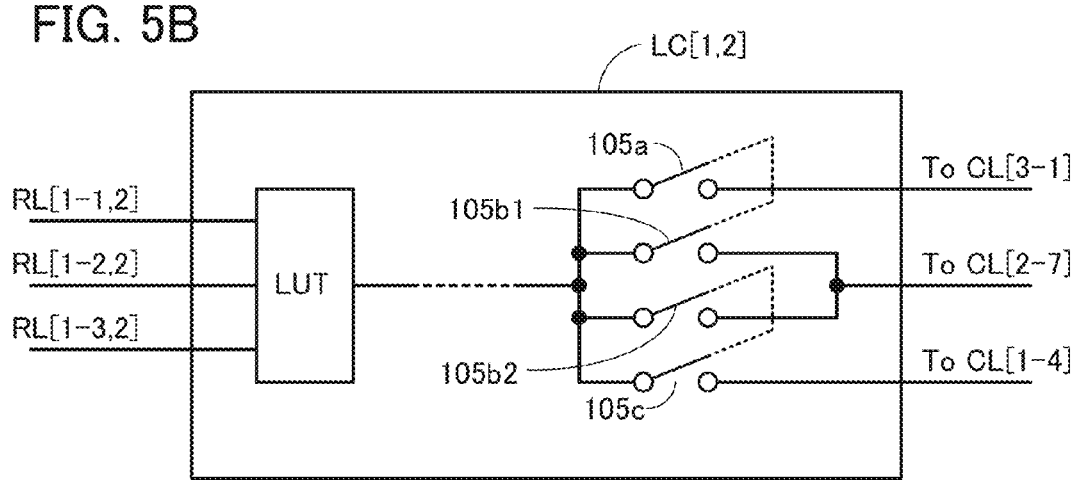

Note that the switches provided between the output of the lookup table LUT and the wirings CL[1-4], CL[2-7], and CL[3-1] may have a configuration as illustrated in FIG. 5B. The logic circuit LC[1, 2] in FIG. 5B includes the switch 105a, a switch 105b1, a switch 105b2, and the switch 105c. The switch 105a and the switch 105b1 are set to be turned on or off simultaneously, and the switch 105b2 and the switch 105c are set to be turned on or off simultaneously. Accordingly, when the switch 105b2 and the switch 105c are off, for example, the output of the logic circuit LC[1, 2] is not transmitted to the logic circuit LC[1, 1].

Figure 5C:
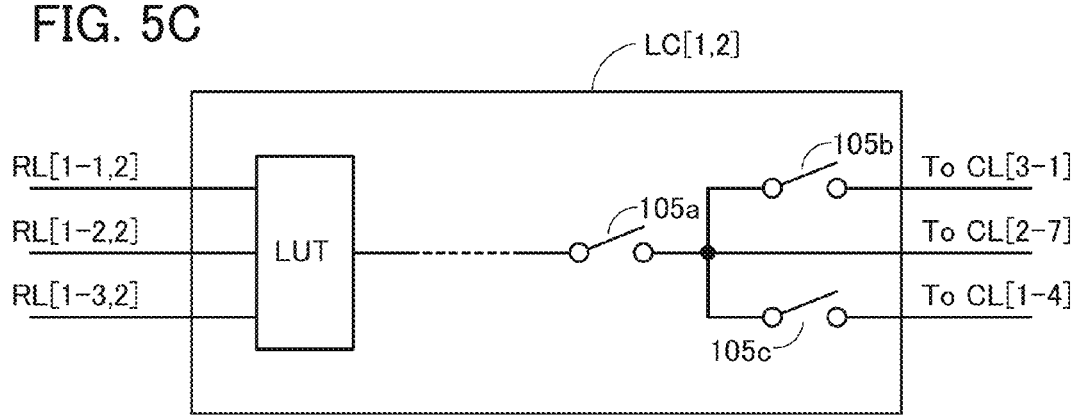

The switches provided between the output of the lookup table LUT and the wirings CL[1-4], CL[2-7], and CL[3-1] may have a configuration as illustrated in FIG. 5C. Any switch can be used as long as the connection between the output of the lookup table LUT and each of the wirings CL[1-4], CL[2-7], and CL[3-1] can be controlled.

Figure 7:
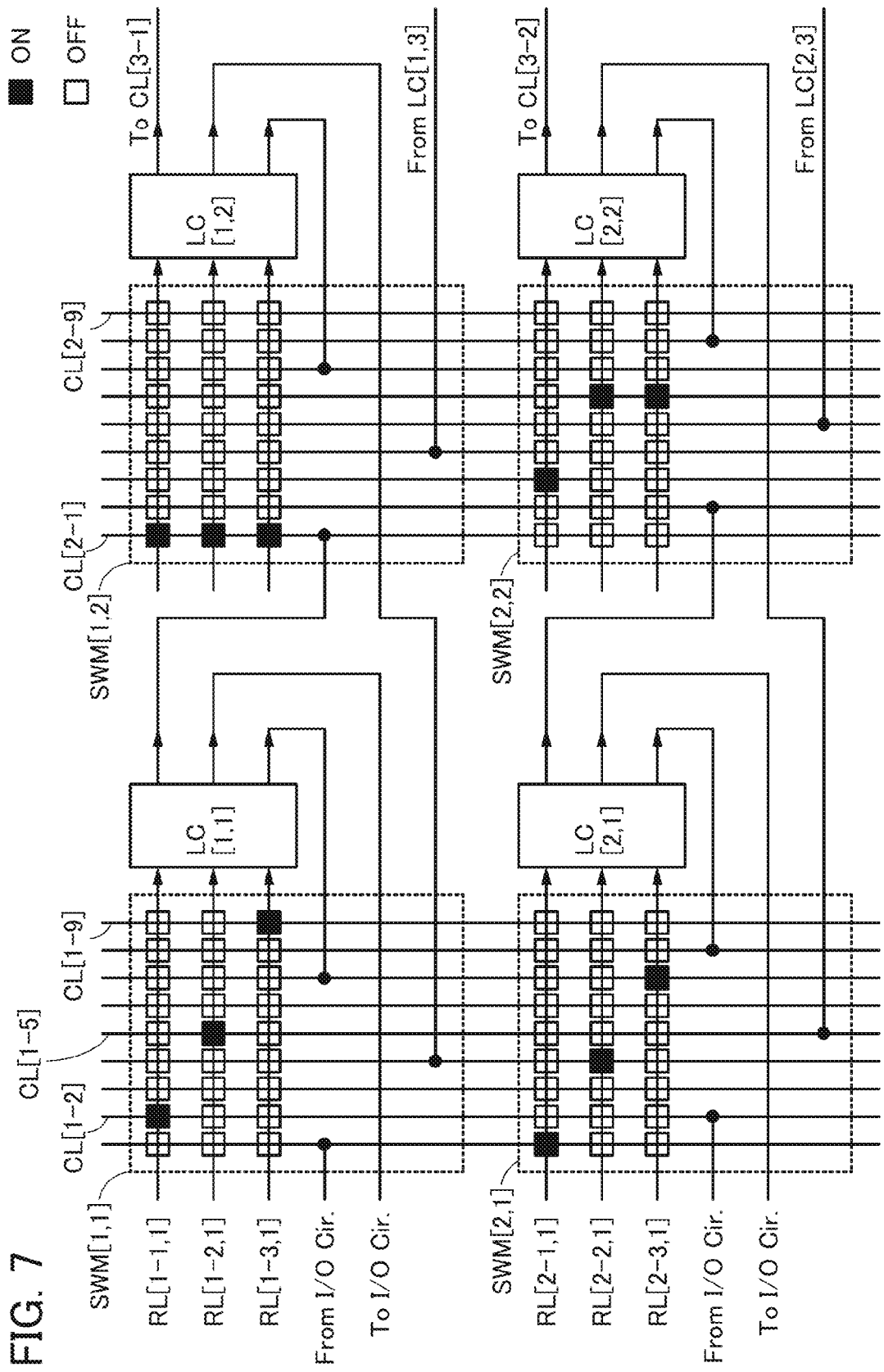
FIG. 7 illustrates an operation example of a data processing device.

The switch array matrix SWM can also be used as part of a combined logic circuit or part of a memory. FIG. 7 illustrates a state where the switch array matrixes SWM are used as a combined logic circuit (drive mode). Here, three outputs from the logic circuit LC are input to corresponding wirings CL, that is, the switches 105a to 105c in FIG. 5A are all on.

In FIG. 7, a black square indicates a programmable switch PSW which is programmed to be on, and a white square indicates a programmable switch PSW which is programmed to be off. In some of programmable switches PSW, one wiring RL and one wiring CL are connected to each other and one or more signals of wirings CL are input to the corresponding logic circuit LC. For example, signals of the wirings CL[1-2], CL[1-5], and CL[1-9] are input to the logic circuit LC[1, 1], and a signal of the wiring CL[2-1] is input to the logic circuit LC[1, 2].

In the case where the programmable switch PSW has the circuit structure of FIG. 3A, the transistors 103 in the programmable switches PSW in plural rows need to be on in the drive mode, so that potentials of the corresponding wirings CWL are preferably the same.

Figure 8:
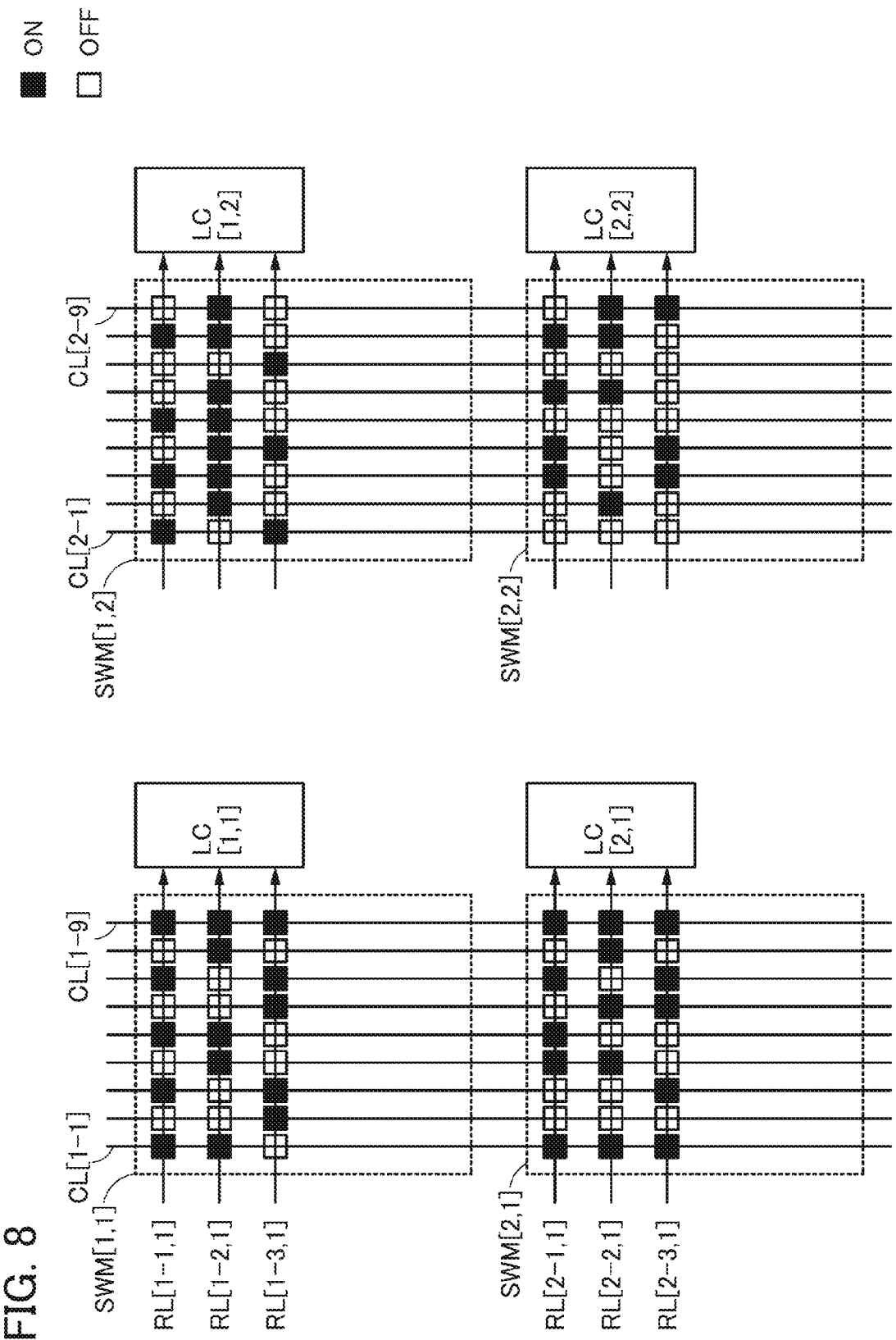
FIG. 8 illustrates an operation example of a data processing device.

FIG. 8 illustrates a state where the switch array matrixes SWM are used as a memory (memory mode). The programmable switch PSW stores data depending on whether it is programmed to be on or off. When a signal of the wiring CL is input to the logic circuit LC, the output of the logic circuit LC is set not to be input to the wiring CL. For example, all the switches 105a to 105c in FIG. 5A are turned off. Therefore, a switch array matrix SWM is isolated from its right and left switch array matrixes SWM. Note that in the memory mode, in the case where the programmable switch PSW has the circuit structure in FIG. 3A, only the transistor 103 in a selected row needs to be turned on in data reading, which is to be described later.

Figure 9:
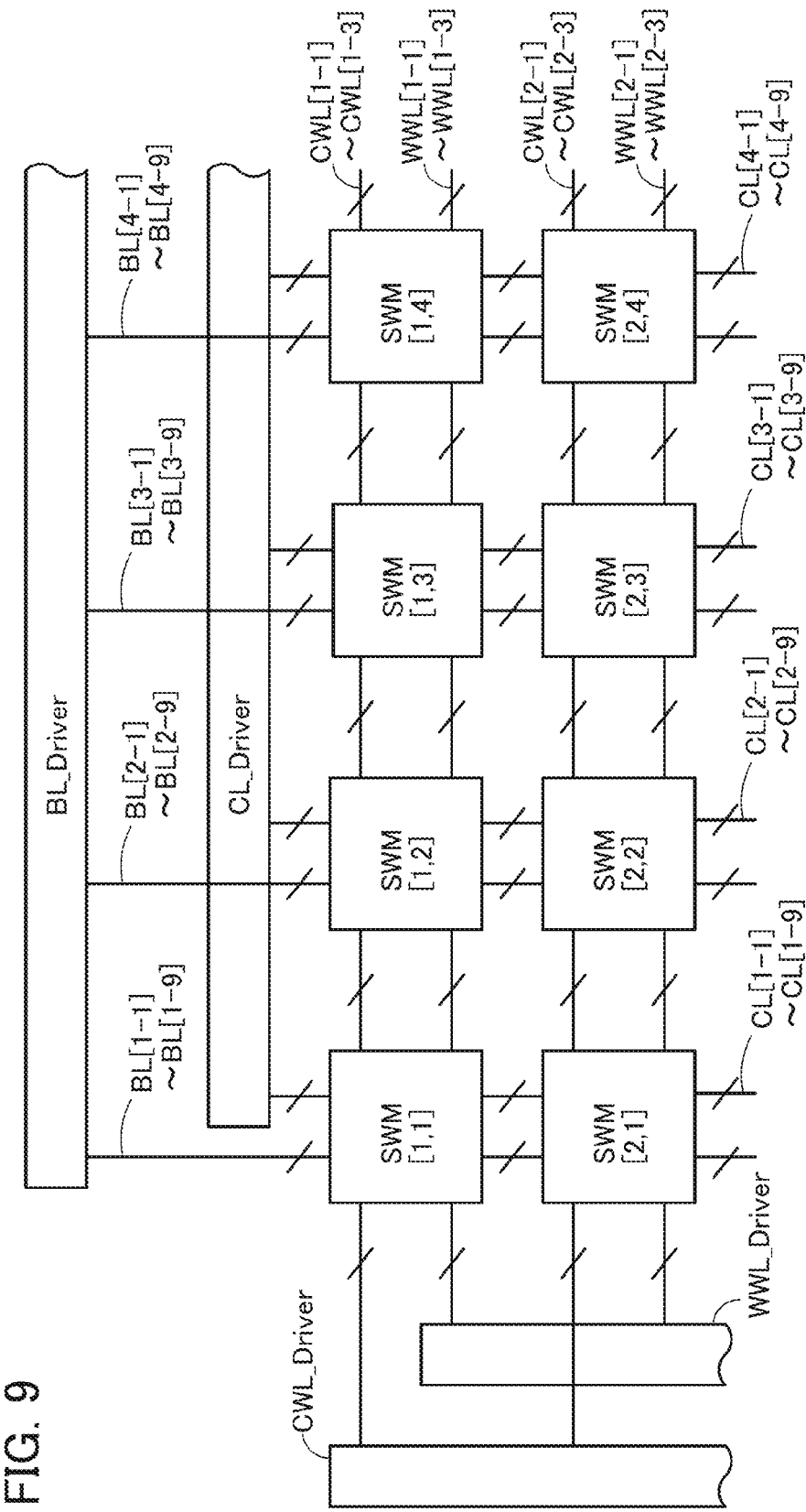
FIG. 9 illustrates a structural example of a data processing device.

In the case where the switch array matrix SWM is used in the memory mode, peripheral circuits need to have something more than those used in the drive mode in some cases. As described above, the wiring BL, the wiring CL, the wiring RL, the wiring WWL, the wiring CWL, and the like are connected to the programmable switch PSW. In the case where the switch array matrix SWM is used in the memory mode, the programmable switch PSW functions as a memory cell and those wirings are used for writing and reading data. Therefore, a driver circuit for setting potentials of the wirings to required levels is needed. FIG. 9 illustrates an example of driver circuits. Note that the logic circuit LC, the wiring RL, the input/output circuit, and the like are omitted from FIG. 9.

In terms of data writing, a driver circuit used in the drive mode can also be used in the memory mode. In other words, data writing in the memory mode can be performed with a driver BL_Driver for transmitting a signal to a wiring BL and a driver WWL_Driver for transmitting a signal to a wiring WWL.

In the case of data reading in the memory mode, a driver CL_Driver, a driver CWL_Driver, and the like are provided to set potentials of the wirings CL, CWL, and RL to levels appropriate for data reading.

Figure 10:
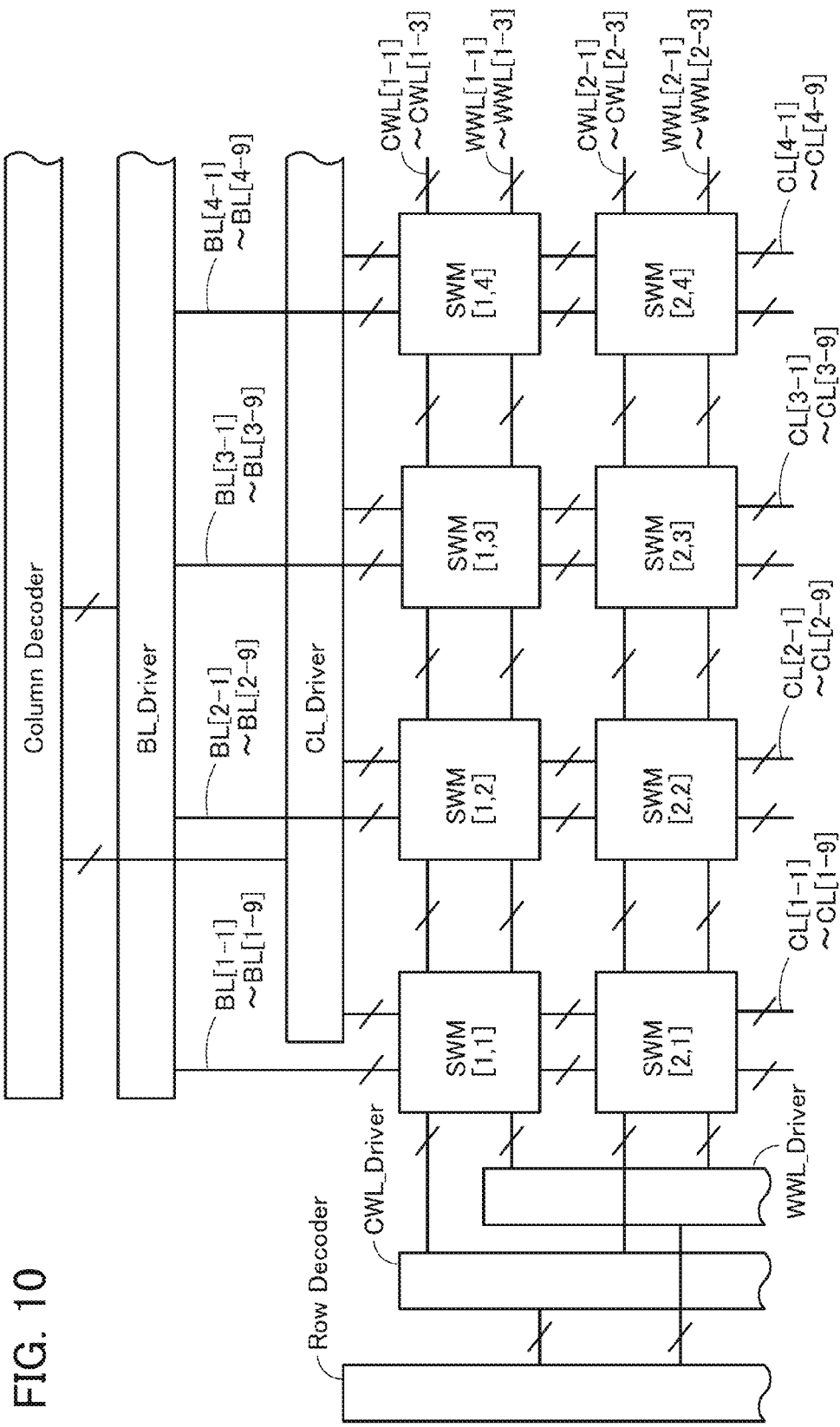
FIG. 10 illustrates a structural example of a data processing device.

Note that the driver BL_Driver and the driver CL_Driver may be integrated into one driver, or the driver WWL_Driver and the driver CWL_Driver may be integrated into one driver. Each of the driver BL_Driver, the driver CL_Driver, the driver WWL_Driver, and the driver CWL_Driver may include its own decoder (or an equivalent circuit capable of specifying a row or a column). Alternatively, as illustrated in FIG. 10, data of a column decoder (Column Decoder) may be transmitted to both the driver BL_Driver and the driver CL_Driver which do not include a decoder, or data of a row decoder (Row Decoder) may be transmitted to both the driver WWL_Driver and the driver CWL_Driver which do not include a decoder. Details thereof are described below.

[Switch Array Matrix SWM]

Figure 11:
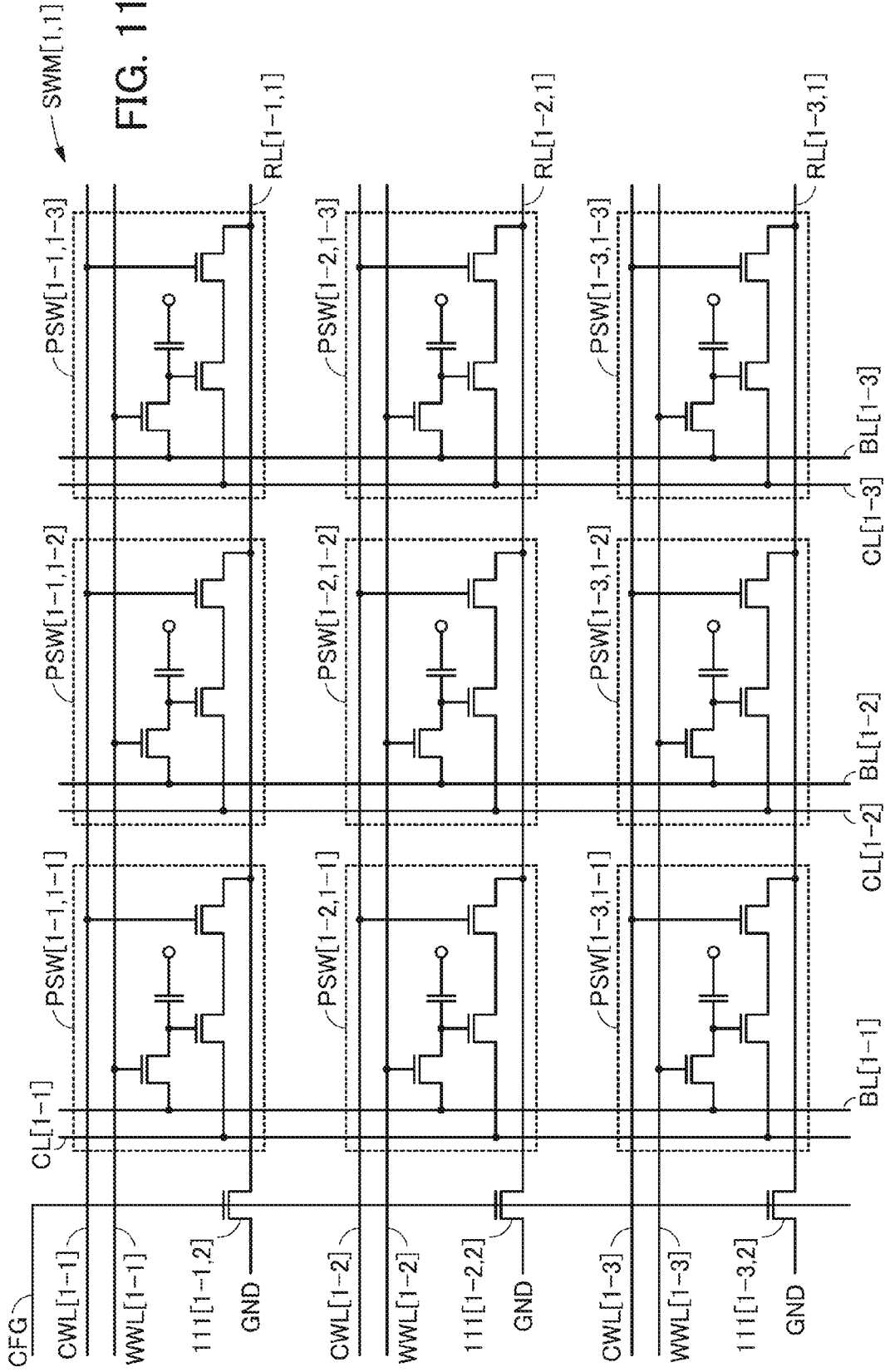
FIG. 11 illustrates a structural example of a data processing device.

FIG. 11 illustrates part of the switch array matrix SWM[1, 1]. The switch array matrix SWM[1, 1] includes a plurality of programmable switches PSW and each of the programmable switches PSW is provided at an intersection of the wiring CL and the wiring RL. Here, each of the programmable switches PSW has the structure in FIG. 3A.

A transistor 111 which is controlled by a wiring CFG is provided for each wiring RL. When the transistor 111 is turned on, the potential of the wiring RL can be set to GND. When the transistor 111 is turned off, the wiring RL can be set to a high impedance state. A latch circuit for reducing the effect of noise and stabilizing a potential may be provided for the wiring RL.

For example, the transistor 111 is turned off in the drive mode. In the case of the memory mode, the transistor 111 is turned on when the switch array matrix SWM is used as a data memory described later, while the transistor 111 is turned off when the switch array matrix SWM is used as a tag memory described later. When the transistors 111 of the switch array matrixes SWM are controlled one by one, one switch array matrix SWM can be used as a data memory (the transistor 111 is on), and another switch array matrix SWM can be used as a tag memory (the transistor 111 is off).

When the transistors 111 are turned on, the corresponding wirings CWL are set to "H", and the transistors 103 of the programmable switches PSW are turned on, the potentials of the wirings CL intersecting with the programmable switches PSW are varied in accordance with states (on and off states) of the corresponding programmable switches PSW. The state of the programmable switch PSW can be determined by utilizing the characteristic, and the programmable switch PSW can be used as a memory cell.

[Driver CL_Driver]

Figure 12:
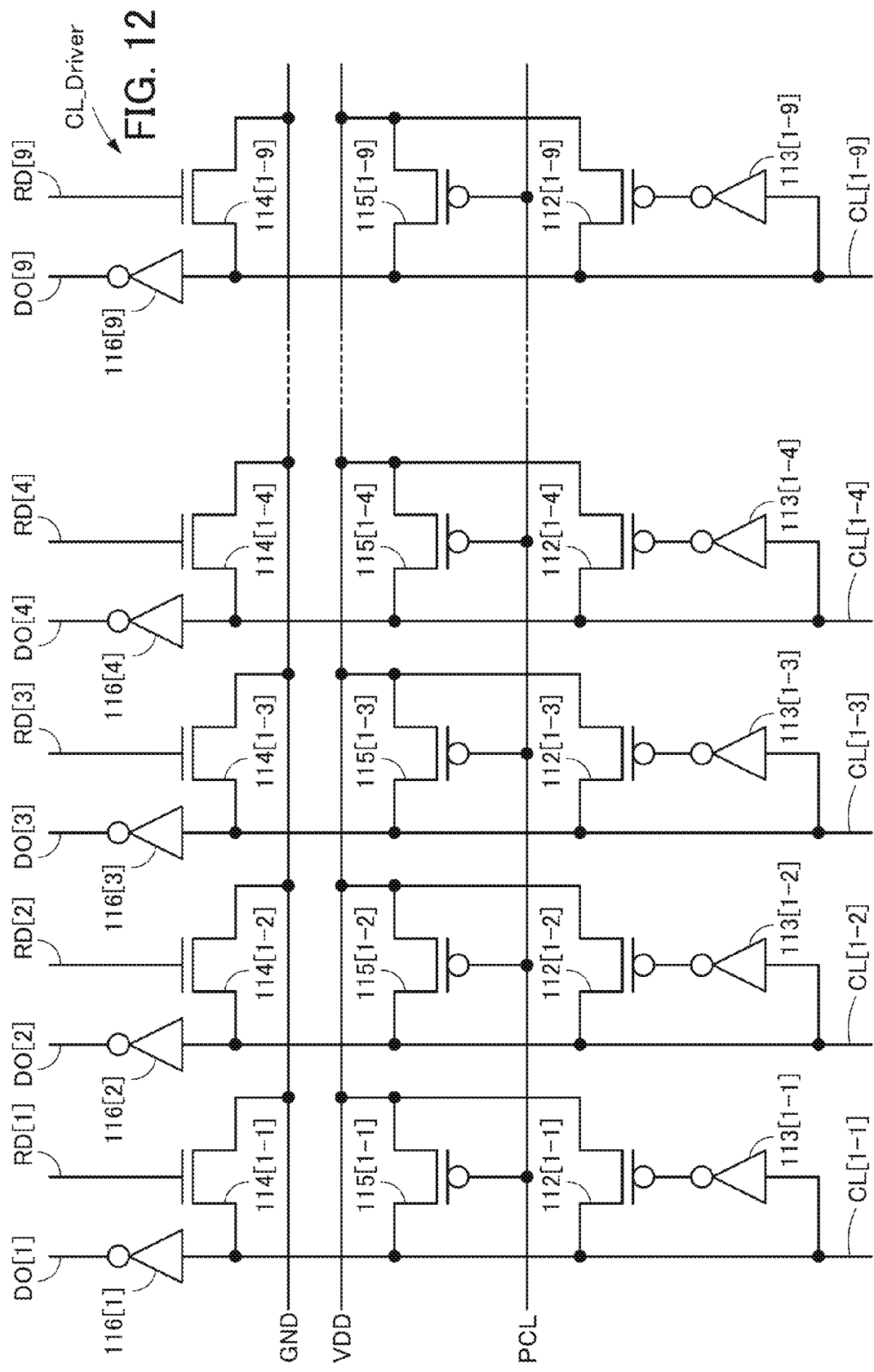
FIG. 12 illustrates a structural example of a data processing device.

FIG. 12 illustrates an example of the driver CL_Driver. The wiring CL is precharged to a potential VDD by the transistor 115 or to a potential GND by the transistor 114. On and off states of the transistor 115 are controlled by a wiring PCL and on and off states of the transistor 114 are controlled by a wiring RD.

The potential of the wiring CL is kept stable by a latch circuit formed of a transistor 112 and an inverter 113. Note that the latch circuit formed of the transistor 112 and the inverter 113 may be omitted. The potential of the wiring CL is output to a wiring DO through an inverter 116.

Figure 13:
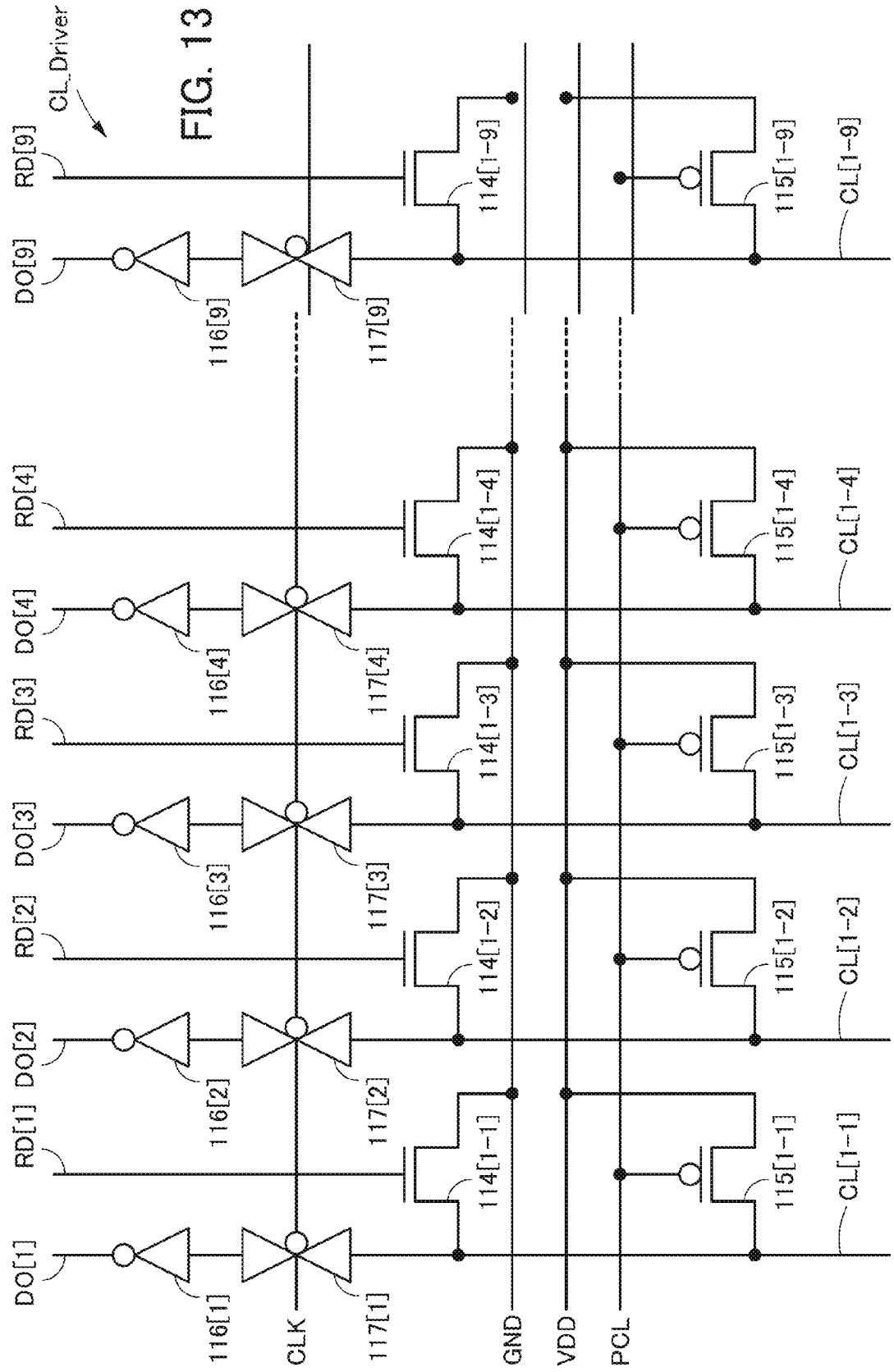
FIG. 13 illustrates a structural example of a data processing device.

FIG. 13 illustrates another example of the driver CL_Driver. In this example, the potential of the wiring CL is transmitted to the wiring DO through the inverter 116 and a transmission gate 117 controlled by a clock signal CLK. A transistor and an inverter may be added to the inverter 116 to form a latch circuit.

[Driver CWL_Driver]

In the case where the switch array matrix SWM in FIG. 1 includes the programmable switch PSW having the structure in FIG. 3A, the same potential is applied to a plurality of the wirings CWL at the same time in the drive mode, whereby the transistors 103 in plural rows can be turned on or off at the same time. In other words, rows are not necessarily specified in this case.

However, as is to be described later, only the transistor 103 in a selected row needs to be turned on in the memory mode. This operation can be performed by a decoder or the like.

Figure 14A:
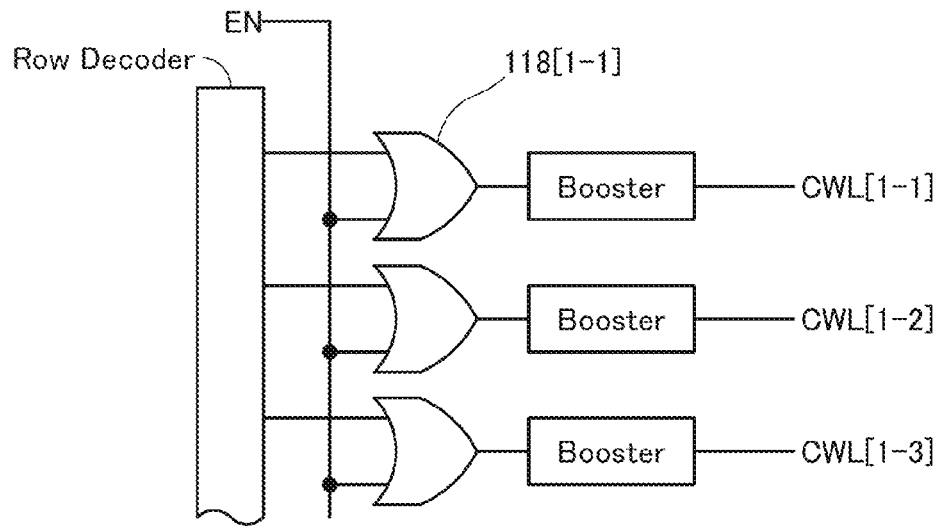
FIGS. 14A and 14B illustrate structural examples of a data processing device.

Thus, an operation needs to be done depending on whether a row is specified or not. Therefore, as an example, a driver CWL_Driver having a structure in FIG. 14A is preferably used. In this example, each output of the row decoder is input to an OR gate 118. A signal EN is also input to the OR gate 118. Accordingly, an output of the OR gate 118 is "H" when one of the signal EN and the output of the row decoder is "H". In the drive mode, when the signal EN is "H", signals of all the wirings CWL are "H". In the memory mode, when the signal EN is "L", only the OR gate 118 in a row in which the output of the row decoder is "H" outputs "H", whereby a given row can be specified.

Figure 14B:
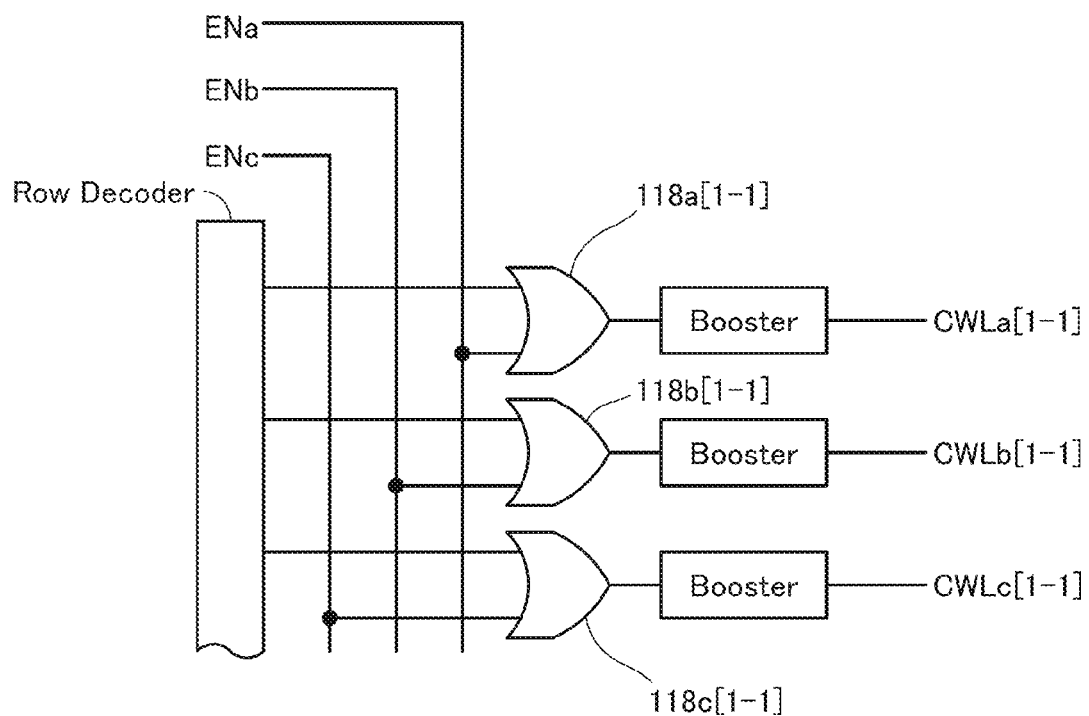

In the case where the programmable switch PSW has the structure in FIG. 4, which includes three wirings CWL (i.e., the wirings CWLa, CWLb, and CWLc), one of the wirings CWL needs to be turned on even in the drive mode. Therefore, as illustrated in FIG. 14B, it is preferable that a first output of the row decoder and a signal ENa be input to an OR gate 118a, that a second output of the row decoder and a signal ENb be input to an OR gate 118b, and that a third output of the row decoder and a signal ENc be input to an OR gate 118c.

In the drive mode, all the outputs of the row decoder are preferably set to "L" and one of the signals ENa to ENc is preferably set to "H". In the memory mode, when all the signals ENa to ENc are set to "L", only the OR gate 118 in a row in which the output of the row decoder is "H" outputs "H", whereby a given row can be specified.

Note that the output of the OR gate may be directly input to the wiring CWL, or input through a circuit such as a booster circuit (Booster), a step-down circuit, or a level-shifter circuit. A similar operation can be performed not only with the OR gate but also with a NOR gate, an XOR gate, an XNOR gate, or a circuit having an equivalent function by inverting a polarity of an input signal, or the like.

In such a logic circuit, when an inversion signal of a signal is separately prepared, a transistor included in the logic circuit can be omitted in some cases. For example, an XOR gate generally includes six transistors, and two of them are used to generate an inversion signal of a signal. Accordingly, with a signal and an inversion signal thereof, four transistors can form a circuit having a function equivalent to the XOR gate.

Next, an operation of the switch array matrix SWM is described. Here, although data writing in the drive mode and in the memory mode, an operation in the drive mode, data reading when used as a general memory (data memory), data reading when used as a tag memory, and verification of data used in the drive mode are described with examples, the switch array matrix SWM can be used for another operation. The above operations can be executed in a manner different from those described below.

[Data Writing]

Figure 15A:
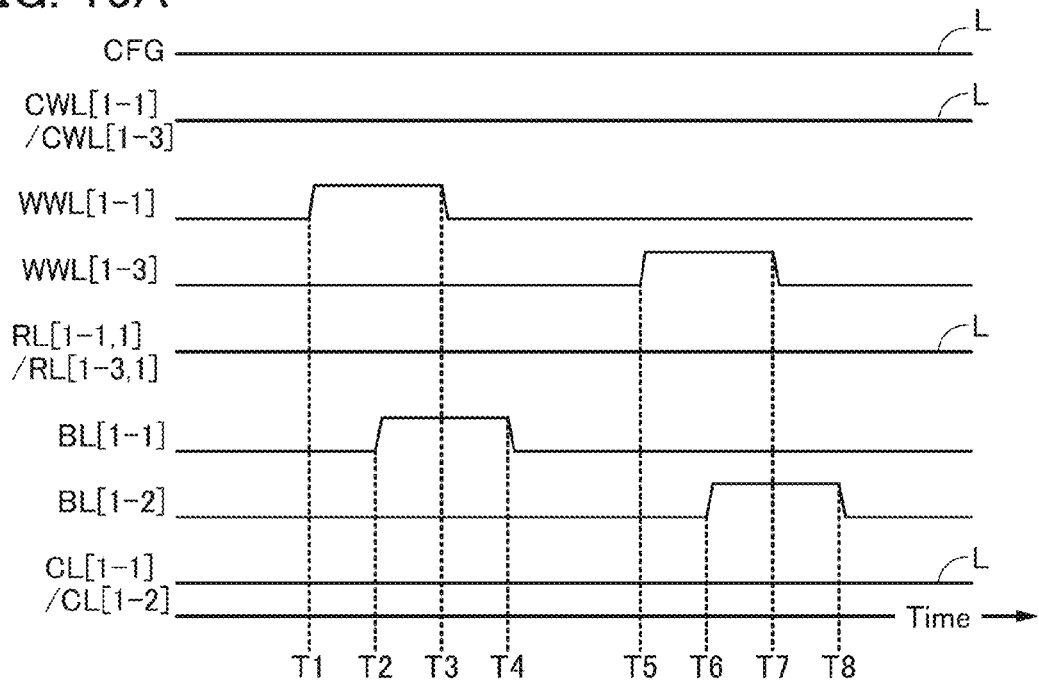
FIGS. 15A and 15B illustrate operation examples of a data processing device.

FIG. 15A shows the case where data "H", "L", "L", and "H" are written in the programmable switches PSW[1-1, 1-1], PSW[1-1, 1-2], PSW[1-3, 1-1], and PSW[1-3, 1-2], respectively. In other words, the programmable switches PSW[1-1, 1-1], PSW[1-1, 1-2], PSW[1-3, 1-1], and PSW[1-3, 1-2] are turned (or programmed to be) on, off, off, and on, respectively.

Before data writing, a reset operation (initialization operation) may be performed. In the reset operation, potentials of the wiring CFG and the wiring WWL are set to "H" and potentials of the wiring BL and the wiring CL are set to "L", whereby potentials of wirings in the switch array matrix SWM and the potentials of the gates of the transistors 102 of the programmable switches PSW are set to "L". As a result, the programmable switches PSW are turned off, whereby an unnecessary short circuit between the wiring CL and the wiring RL can be avoided.

Data is written in the following manner. The potential of the wiring WWL[1-1] is set to "H", so that the transistors 101 of the programmable switches PSW[1-1, 1-1] and PSW[1-1, 1-2] are turned on (time T1). At this time, since the potential of the wiring WWL[1-3] is "L", the transistors 101 of the programmable switches PSW[1-3, 1-1] and PSW[1-3, 1-2] are off.

Then, the potential of the wiring BL[1-1] is set to "H" and the potential of the wiring BL[1-2] is kept at "L" (time T2). Accordingly, the potentials of the gates of the transistors 102 of the programmable switches PSW[1-1, 1-1] and PSW[1-1, 1-2] become "H" and "L". After that, the potential of the wiring WWL[1-1] is set to "L", whereby the transistors 101 of the programmable switches PSW[1-1, 1-1] and PSW[1-1, 1-2] are turned off (time T3). The potential of the wiring WWL[1-1] is kept at "L" except for a data writing period.

Then, the potential of the wiring WWL[1-3] is set to "H", so that the transistors 101 of the programmable switches PSW[1-3, 1-1] and PSW[1-3, 1-2] are turned on (time T5). At this time, since the potential of the wiring WWL[1-1] is at "L", the transistors 101 of the programmable switches PSW[1-1, 1-1] and PSW[1-1, 1-2] remains off.

Then, the potential of the wiring BL[1-1] is kept at "L" and the potential of the wiring BL[1-2] is set to "H" (time T6). Accordingly, the potentials of the gates of the transistors 102 of the programmable switches PSW[1-3, 1-1] and PSW[1-3, 1-2] become "L" and "H". After that, the potential of the wiring WWL[1-3] is set to "L", whereby the transistors 101 of the programmable switches PSW[1-3, 1-1] and PSW[1-3, 1-2] are turned off (time T7). The potential of the wiring WWL[1-3] is kept at "L" except for a data writing period.

Through the above steps, the potentials of the wiring CL and the wiring RL may be kept at "L", for example. Thus, the above-described boosting effect can be obtained. For example, the transistor 114 may be turned on and the potentials of the wiring CL[1-1] and the wiring CL[1-2] may become GND (i.e., "L") by setting potentials of a wiring RD[1] and a wiring RD[2] to "H". Alternatively, the transistor 111 may be turned on and the potential of the wiring RL may become GND by setting the potential of the wiring CFG to "H".

Note that the potentials of the wirings CWL[1-1] and CWL[1-3] may be either "L" or "H". In other words, the transistors 103 may be either on or off. In the operation in FIG. 15A, the potentials of the wirings CWL[1-1] and CWL[1-3] are "L", i.e., the transistors 103 are off. Even in this case, since the potentials of the wirings CL[1-1] and CL[1-2] are GND, the boosting effect can be obtained. In the case where the programmable switch PSW has the configuration in FIG. 3B, the boosting effect can also be obtained when the transistors 103 are off and the potentials of the wirings RL are GND.

Note that before an operation in the drive mode, configuration data is preferably written also in a memory in the logic circuit LC concurrently with, before, or after the above operation.

[Operation in Drive Mode]

Figure 15B:
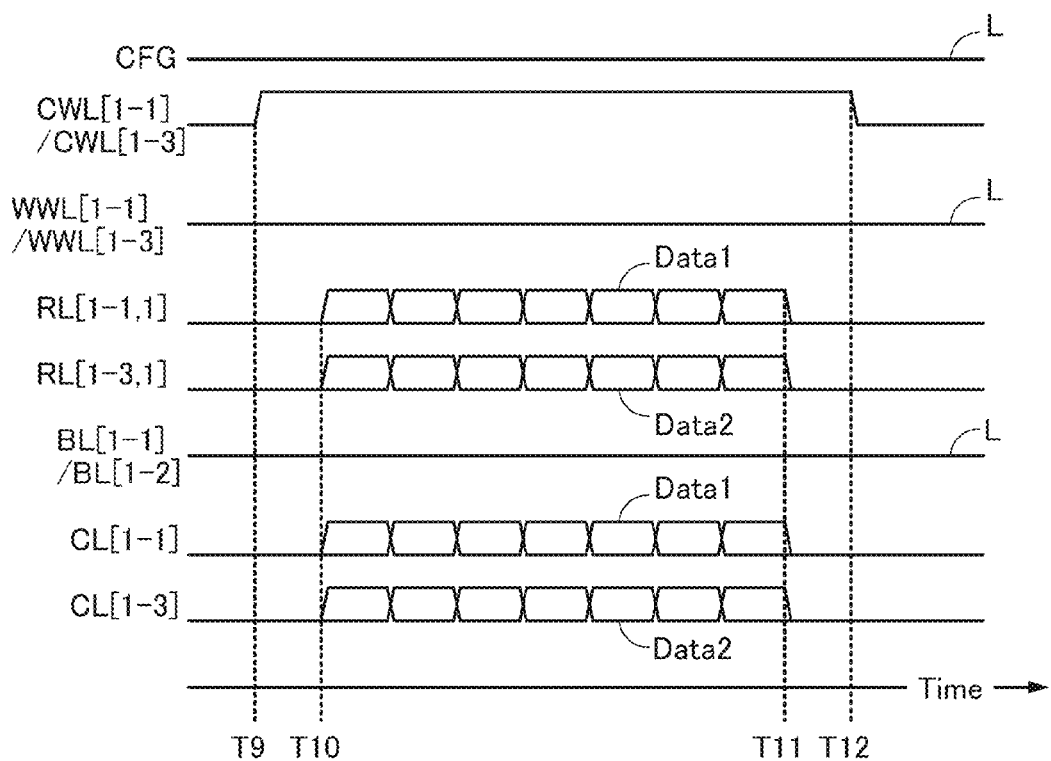

FIG. 15B is an example of an operation in the drive mode. In the drive mode, data is input to the wiring CL from the input/output circuit or the logic circuit LC, and whether or not a signal is transmitted to the wiring RL is determined in accordance with a state (on or off state) of each programmable switch PSW. At this time, the potentials of the wiring CL and the wiring RL should be the potential of the signal. Therefore, the potentials of the wiring CFG and the wiring RD are set to "L", the potential of the wiring PCL is set to "H", and the transistors 111, 114, 115, and the like are off.

First, the potentials of the wirings CWL are set to "H", so that the transistors 103 are turned on (time T9). In addition, some or all of switches which control the connection between the logic circuits and the wirings CL, such as the switches 105a to 105c (see FIGS. 5A to 5C) in the logic circuit LC, are turned on. Some or all of the switches which control the connection between the input/output circuits and the wirings CL are also turned on. The potentials of the wirings WWL are kept at "L". The potentials of the wirings BL are not particularly limited as long as each programmable switch PSW can retain data. Here, for example, the potentials of the wirings BL are set to "L". In this state, a signal is supplied to the switch array matrixes SWM from the outside (time T10).

In the above example, data "H", "L", "L", and "H" have been written in the respective programmable switches PSW[1-1, 1-1], PSW[1-1, 1-2], PSW[1-3, 1-1], and PSW[1-3, 1-2]. Therefore, for example, data DATA1 of the wiring CL[1-1] is transmitted to the wiring RL[1-1, 1] through the programmable switch PSW[1-1, 1-1] and data DATA2 of the wiring CL[1-2] is transmitted to the wiring RL[1-3, 1] through the programmable switch PSW[1-3, 1-2].

[Operation of Reading from Data Memory]

Also in the memory mode, data writing can be performed in the manner described in the above [Data writing]. Here, an example is described with reference to FIG. 16A in which data "H", "L", "L", and "H" are written in the programmable switches PSW[1-1, 1-1], PSW[1-1, 1-2], PSW[1-3, 1-1], and PSW[1-3, 1-2], respectively, as described in [Data writing], and the written data are read by the driver CL_Driver in FIG. 12.

In data reading, switches which control the connection between the logic circuits and the wirings CL, such as the switches 105a to 105c in the logic circuit LC, are turned off. The switches which control the connection between the input/output circuits and the wirings CL are also turned off. In addition, the potential of the wiring CFG is set to "H", the transistor 111 is turned on, and the potential of the wiring RL is set to GND.

The data in the programmable switches PSW[1-1, 1-1] and PSW[1-1, 1-2] are read first. The potential of the wiring CWL[1-1] is set to "H" (time T13). Accordingly, the transistors 103 of the programmable switches PSW[1-1, 1-1] and PSW[1-1, 1-2] are turned on.

Then, the potential of the wiring PCL is set to "L", so that the transistor 115 is turned on (time T14). As a result, the potentials of the wirings CL become VDD (i.e., "H"), and the potentials of the wirings DO[1] and DO[2] become "L".

After that, the potential of the wiring PCL is set to "H", so that the transistor 115 is turned off (time T15). Here, since the programmable switch PSW[1-1, 1-1] is on, the wiring CL[1-1] is connected to the wiring RL[1-1] through the programmable switch PSW[1-1, 1-1] and the wiring RL[1-1] is still supplied with the potential GND. Therefore, the potential of the wiring CL[1-1] becomes GND (the potential of the wiring DO[1] becomes "H"). In contrast, since the programmable switch PSW[1-1, 1-2] is off, the wiring CL[1-2] is disconnected from the wiring RL[1-1] and other wirings and the potential of the wiring CL[1-2] remains at VDD (the potential of the wiring DO[2] remains at "L"). Then, the potential of the wiring CWL[1-1] is set to "L" (time T16).

In this way, states (on and off states) of the programmable switches PSW[1-1, 1-1] and PSW[1-1, 1-2] can be determined with the potentials of the wirings DO[1] and DO[2] after the potential of the wiring PCL is set to "H". Thus, the stored data can be read.

Data in the programmable switches PSW[1-3, 1-1] and PSW[1-3, 1-2] can be read in the same manner. The potential of the wiring CWL[1-3] is set to "H" (time T17). Accordingly, the transistors 103 of the programmable switches PSW[1-3, 1-1] and PSW[1-3, 1-2] are turned on. Since the programmable switch PSW[1-3, 1-2] is on, the wiring CL[1-2] is connected to the wiring RL[1-3] and the potential of the wiring CL[1-2] becomes GND.

Then, in the same manner as above, the potential of the wiring PCL is set to "L" and the potentials of the wirings CL are set to VDD (the potentials of the wirings DO[1] and DO[2] are set to "L", time T18). After that, the potential of the wiring PCL is set to "H" (time T19).

Since the programmable switch PSW[1-3, 1-2] is on, the wiring CL[1-2] is connected to the wiring RL[1-3] through the programmable switch PSW[1-3, 1-2]. The wiring RL[1-3] is supplied with GND. Therefore, the potential of the wiring CL[1-2] becomes GND (the potential of the wiring DO[2] becomes "H"). In contrast, since the programmable switch PSW[1-3, 1-1] is off, the wiring CL[1-1] is disconnected from the wiring RL[1-3] and other wirings and the potential of the wiring CL[1-1] remains at VDD (the potential of the wiring DO[1] remains at "L"). Then, the potential of the wiring CWL[1-3] is set to "L" (time T20).

Figure 16A:
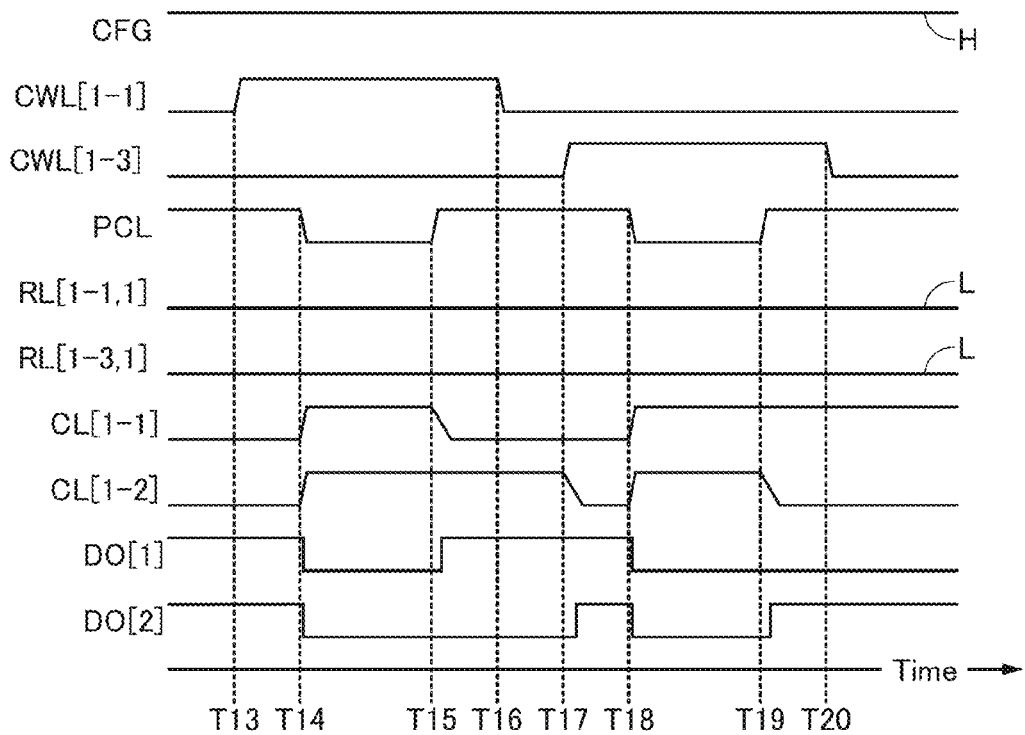
FIGS. 16A and 16B illustrate operation examples of a data processing device.

In the method described with reference to FIG. 16A, the potential of the wiring RL[1-1, 1] is set to GND with the use of the transistor 111. This can also be performed in such a manner that the transistors 114 in FIG. 12 or FIG. 13 are turned on with the programmable switch PSW[1-1, 1-9] on, for example. In this case, the transistor 111 and the wiring CFG are not needed.

Figure 16B:
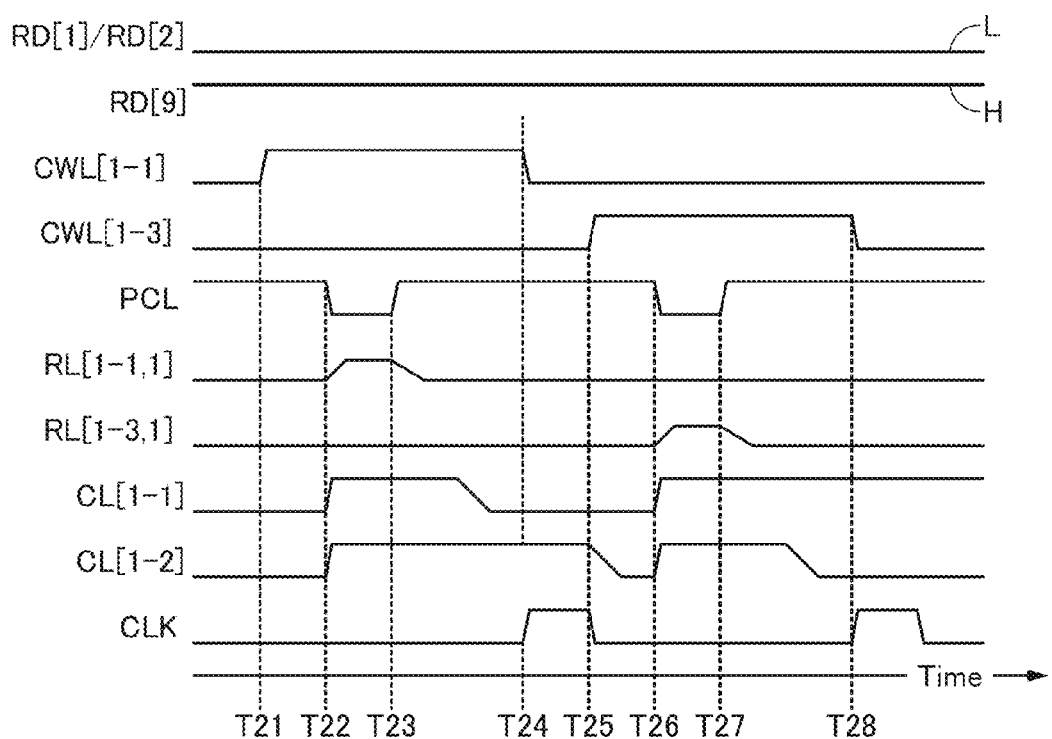

However in this case, since the transistor 114 and the transistors 102 and 103 of the programmable switch PSW[1-1, 1-9] are provided between the wiring RL[1-1, 1] and the wiring of the potential GND, it takes longer time to set the potential of the wiring RL[1-1, 1] to a predetermined level in some cases. Furthermore, data cannot be written in some of the programmable switches PSW (the programmable switch PSW[1-1, 1-9] in the above case). Data reading by such a method is described with reference to FIG. 16B. Although the driver CL_Driver having the configuration in FIG. 13 is used, the driver CL_Driver may have the configuration in FIG. 12.

Here, data "H", "L", "L", and "H" are written in the programmable switches PSW[1-1, 1-1], PSW[1-1, 1-2], PSW[1-3, 1-1], and PSW[1-3, 1-2], respectively. Although "H" is also written in each of the programmable switches PSW[1-1, 1-9] and PSW[1-3, 1-9], this "H" is not data.

The potentials of the wirings RD[1] and RD[2] are kept at "L" and the potential of the wiring RD[9] is kept at "H". The potentials of the wirings RL are initially GND. First, the potential of the wiring CWL[1-1] is set to "H" (time T21). Accordingly, the transistors 103 of the programmable switches PSW[1-1, 1-1] and PSW[1-1, 1-2] are turned on.

Next, the potential of the wiring PCL is set to "L", so that the transistor 115 is turned on (time T22). Accordingly, the potentials of the wirings CL become VDD (i.e., "H"). Charge also flows into the wiring RL[1-1, 1] through a programmable switch PSW in the on state of the programmable switches PSW[1-1, 1-1] to PSW[1-1, 1-9], so that the potential of the wiring RL[1-1, 1] increases.

Then, the potential of the wiring PCL is set to "H", so that the transistor 115 is turned off (time T23). The potential of the wiring RL[1-1, 1] decreases to GND. Since the programmable switch PSW[1-1, 1-1] is on at this time, the potential of the wiring CL[1-1] also becomes GND. In contrast, the programmable switch PSW[1-1, 1-2] is off, so that the potential of the wiring CL[1-2] remains at VDD. The transmission gate 117 is turned on with a clock signal CLK (time T24), and the potentials of the wirings CL[1-1] and CL[1-2] are taken out to the wirings DO[1] and DO[2] through the inverters 116[1] and 116[2], so that data can be read.

Data can be read from the programmable switches PSW[1-3, 1-1] and PSW[1-3, 1-2] in the same manner. The potential of the wiring CWL[1-3] is set to "H" (time T25). Accordingly, the transistors 103 of the programmable switches PSW[1-3, 1-1] and PSW[1-3, 1-2] are turned on. Since the programmable switch PSW[1-3, 1-2] is on, the wiring CL[1-2] is connected to the wiring RL[1-3] and the potential of the wiring CL[1-2] becomes GND.

Then, in the same manner as above, the potential of the wiring PCL is set to "L" and the potentials of the wirings CL are set to VDD (time T26). After that, the potential of the wiring PCL is set to "H" (time T27).

Since the programmable switch PSW[1-3, 1-2] is on, the wiring CL[1-2] is connected to the wiring RL[1-3] through the programmable switch PSW[1-3, 1-2]. The wiring RL[1-3] is supplied with the potential GND. Therefore, the potential of the wiring CL[1-2] becomes GND. In contrast, since the programmable switch PSW[1-3, 1-1] is off, the wiring CL[1-1] is disconnected from the wiring RL[1-3] and other wirings and the potential of the wiring CL[1-1] remains at VDD (the potential of the wiring DO[1] remains at "L"). Then, the potential of the clock signal CLK is set to "H" (time T28), and then the potentials of the wirings CL[1-1] and CL[1-2] are taken out. Thus, the data can be read.

[Reading Operation of Tag Memory]

A data memory is a memory in which by specifying an address, data stored in the address is returned. By specifying data, data on whether data matching the specified data is stored is returned, or an address where data matching the specified data is stored or data related to the address is returned. The memory of this type is called a content addressable memory (CAM).

For example, a sequence is stored in a tag memory of a cache memory of a CPU. The sequence itself is not needed, but whether the sequence is the same with a reference sequence or not is required in some cases. Note that details and an operation of the cache memory are described later. The above-described programmable switch PSW can be used as not only a data memory but also a CAM and a tag memory (and a comparison circuit). A method in which the programmable switch PSW is used as a tag memory (and a comparison circuit) is described below. Although the driver CL_Driver having the configuration in FIG. 12 is used, the driver CL_Driver may have the configuration in FIG. 13.

For example, as shown in FIG. 11 and FIG. 12, the programmable switch PSW[1-1, 1-1] and the transistor 114[1-1] are provided in series between the wiring of the potential GND and the wiring RL[1-1]. Therefore, when both the programmable switch PSW[1-1, 1-1] and the transistor 114[1-1] are on, the potential of the wiring RL[1-1] becomes GND, whereas when one of the programmable switch PSW[1-1, 1-1] and the transistor 114[1-1] is off, the potential of the wiring RL[1-1] might not be GND.

For example, in the case where the programmable switches PSW[1-1, 1-1] and PSW[1-1, 1-2] are programmed so that one of them is on and the other is off and the transistors 114[1-1] and 114[1-2] are set so that one of them is on and the other is off, the potential of the wiring RL[1-1] becomes a potential other than GND only when one of the programmable switch PSW[1-1, 1-1] and the transistor 114[1-1] (i.e., one of the programmable switch PSW[1-1, 1-2] and the transistor 114[1-2]) is on and the other is off. In other words, the potential of the wiring RL[1-1] becomes a potential other than GND only when the programmable switch PSW[1-1, 1-1] and the transistor 114[1-2] (i.e., the programmable switch PSW[1-1, 1-2] and the transistor 114[1-1]) are in the same state.

Thus, whether data stored in the programmable switches PSW[1-1, 1-1] and PSW[1-1, 1-2] match data supplied to the transistors 114[1-1] and 114[1-2] can be verified. In other words, the switch array matrix SWM can be used as a comparison circuit. For example, the switch array matrix SWM can be used as one set of tag memories in a cache memory.

In the case where the switch array matrix SWM is used as tag memories, a pair of programmable switches PSW in the same row is used as one bit. Data is written in one of the programmable switches PSW, and inversion data is written in the other. For example, in each of a pair of the programmable switches PSW[1-1, 1-1] and PSW[1-1, 1-2], a pair of the programmable switches PSW[1-1, 1-3] and PSW[1-1, 1-4], a pair of the programmable switches PSW[1-1, 1-5] and PSW [1-1, 1-6], and a pair of the programmable switches PSW[1-1, 1-7] and PSW[1-1, 1-8], data is written in one of the programmable switches PSW and inversion data is written in the other.

Figure 17A:
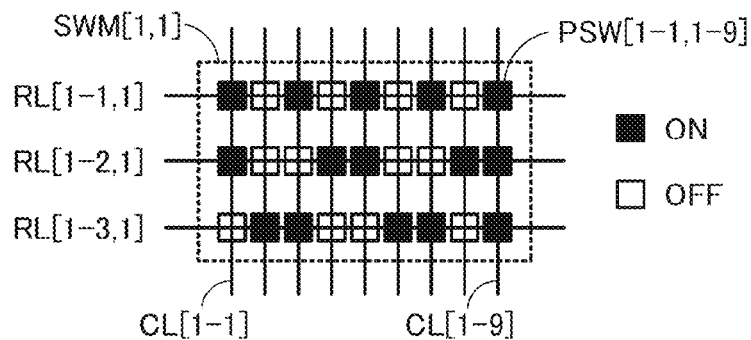
FIGS. 17A and 17B illustrate an operation example of a data processing device.

For example, as illustrated in FIG. 17A, data "H", "H", "H", and "H" are written in the programmable switches PSW [1-1, 1-1], PSW[1-1, 1-3], PSW[1-1, 1-5], and PSW[1-1, 1-7], respectively, while inversion data "L", "L", "L", and "L" are written in the programmable switches PSW[1-1, 1-2], PSW[1-1, 1-4], PSW[1-1, 1-6], and PSW[1-1, 1-8], respectively.

Figure 17B:
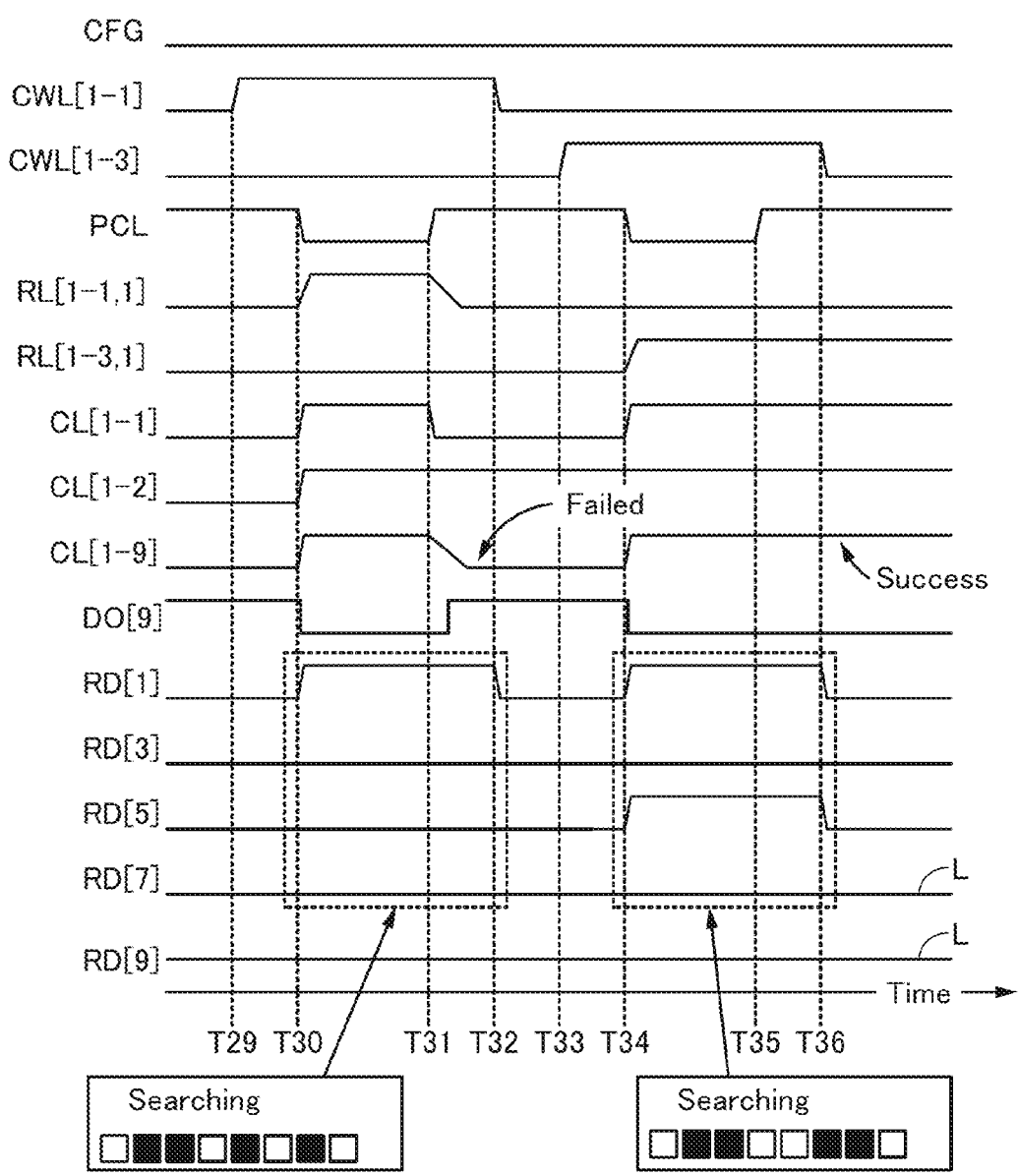

Data "H" is written in the programmable switch PSW[1-1, 1-9] for connection between the wiring RL[1-1, 1] and the wiring CL[1-9]. As is to be described later, the outcome is produced in the wiring CL[1-9] (or the wiring DO[9]). With reference to FIG. 17B, described below are the cases of determining whether data "L", "H", "H", "L", "H", "L", "H", and "L" are stored or not in the respective programmable switches PSW[1-1, 1-1] to PSW[1-1, 1-8], and whether data "L", "H", "H", "L", "L", "H", "H", and "L" are stored or not in the respective programmable switches PSW[1-3, 1-1] to PSW[1-3, 1-8].

First, the potential of the wiring CWL[1-1] is set to "H" (time T29). Accordingly, the transistors 103 of the programmable switches PSW[1-1, 1-1] to PSW[1-1, 1-9] are turned on.

Then, the potential of the wiring PCL is set to "L", so that the transistor 115 is turned on (time T30). The potentials of the wirings RD[1] to RD[8] are set corresponding to reference data. In other words, whether data "L", "H", "H", "L", "H", "L", "H", and "L" are stored or not in the respective programmable switches PSW[1-1, 1-1] to PSW[1-1, 1-8] can be determined by setting the corresponding wirings RD[1], RD[2], RD[3], RD[4], RD[5], RD[6], RD[7], and RD[8] to "H", "L", "L", "H", "L", "H", "L", and "H", respectively. In other words, inversion data of the reference data are input. In FIG. 17B, only signals of the wirings RD[1], RD[3], RD[5], and RD[7] are shown. Signals of the wirings RD[2], RD[4], RD[6], and RD[8] are inversion signals of the wirings RD[1], RD[3], RD[5], and RD[7].

Consequently, the transistors 114[1-1], 114[1-4], 114[1-6], and 114[1-8] are turned on, whereas the transistors 114 [1-2], 114[1-3], 114[1-5], and 114[1-7] are turned off.

In the case where of each of the pairs of the transistors 114 and the corresponding programmable switches PSW, one of them is on and the other is off (that is, data of the programmable switches PSW[1-1, 1-1] to PSW[1-1, 1-8] are reference data), the potential of the wiring RL[1-1, 1] becomes VDD. In the case where any one of the programmable switches PSW corresponding to the transistors 114 in the on state is on (that is, data of the programmable switches PSW [1-1, 1-1] to PSW[1-1, 1-8] are not reference data), the potential of the RL[1-1, 1] does not increase to VDD, or even when the potential of the RL[1-1, 1] increases to VDD, the potential rapidly decreases to GND after the potential of the wiring PCL is set to "H" and the transistor 115 is turned off (time T31).

In the above example, the transistor 114[1-1] is on and the corresponding programmable switch PSW[1-1, 1-1] is also on, so that the wiring RL[1-1, 1] is connected to the wiring of the potential GND through the transistor 114[1-1] and the programmable switch PSW[1-1, 1-1], and the potential of the wiring RL[1-1, 1] becomes GND. The wiring CL[1-9] is connected to the wiring RL[1-1, 1] through the programmable switch PSW[1-1, 1-9], so that the potential of the wiring CL[1-9] also becomes GND. This outcome is output to the wiring DO[9] through the inverter 116. The potential of the wiring DO[9] becomes "H" in this example.

Next, the potential of the wiring CWL [1-3] is set to "H" (time T33). As a result, the transistors 103 of the programmable switches PSW[1-3, 1-1] to PSW[1-3, 1-9] are turned on.

Then, the potential of the wiring PCL is set to "L", so that the transistor 115 is turned on (time T34). The potentials of the wirings RD[1] to RD[8] are set corresponding to reference data. In other words, whether data "L", "H", "H", "L", "L", "H", "H", and "L" are stored or not in the respective programmable switches PSW[1-3, 1-1] to PSW[1-3, 1-8] can be determined by setting the corresponding wirings RD[1], RD[2], RD[3], RD[4], RD[5], RD[6], RD[7], and RD[8] to "H", "L", "L", "H", "H", "L", "L", and "H", respectively.

Consequently, the transistors 114[1-1], 114[1-4], 114[1-5], and 114[1-8] are turned on, whereas the transistors 114 [1-2], 114[1-3], 114[1-6], and 114[1-7] are turned off.

In this case, all the programmable switches PSW corresponding to the transistors 114 in the off state are on, whereas all the programmable switches PSW corresponding to the transistors 114 in the on state are off; thus, the potential of the wiring RL[1-1, 1] becomes VDD. Since the wiring CL[1-9] is connected to the wiring RL[1-1, 1] through the programmable switch PSW[1-1, 1-9], the potential of the wiring CL[1-9] also becomes VDD. The outcome is output to the wiring DO[9] through the inverter 116. The potential of the wiring DO[9] becomes "L" in this example. In other words, the wiring DO[9] outputs "L" when the same data as the reference data exists.

[Verification of Data Used in Drive Mode]

In the drive mode, a situation where a programmable switch PSW which should be off is turned on for some reason leads to an abnormal operation. Therefore, the programmable switch PSW needs to be checked for abnormalities as appropriate. Since the state of the programmable switch PSW can be read in the above manner, an operation in the drive mode is stopped as appropriate and transferred to an operation in the memory mode, and whether data is correct can be verified.

For example, states of some or all of the programmable switches PSW are read by the method described in [Operation of reading from data memory], and whether the obtained sequence is the same as the original sequence or not can be determined by cyclic redundancy check (CRC) or the like.

Thus, in the memory mode, the switch array matrix SWM can be used as a data memory or a tag memory. When a transistor including an oxide semiconductor and having extremely small off-state current is used as the transistor 101 (or the transistors 101*a* to 101*c*), a substantially nonvolatile memory can be obtained.

As illustrated in FIG. 8, the switch array matrix SWM[1, 1] and the switch array matrix SWM[2, 1] can be used as a group of memories, and the switch array matrix SWM[1, 2] and the switch array matrix SWM[2, 2] can be used as another group of memories, whereby the former group can be used as a tag memory and the latter group can be used as a data memory, for example. Alternatively, the former can be used as a data memory and the latter can be used as a tag memory, or both can be used as data memories. Note that in the case where the switch array matrixes SWM are used only as data memories, the transistor 114 in FIG. 12 or FIG. 13 and wirings related thereto are not needed.

In the above example, a switch array matrix SWM with a relatively small scale is described; however, the above description can be applied to a switch array matrix SWM with a larger scale. Furthermore, the switch array matrix SWM can operate in a similar manner even in a configuration other than the configuration of the data processing device 100 in FIG. 1.

Figure 18:
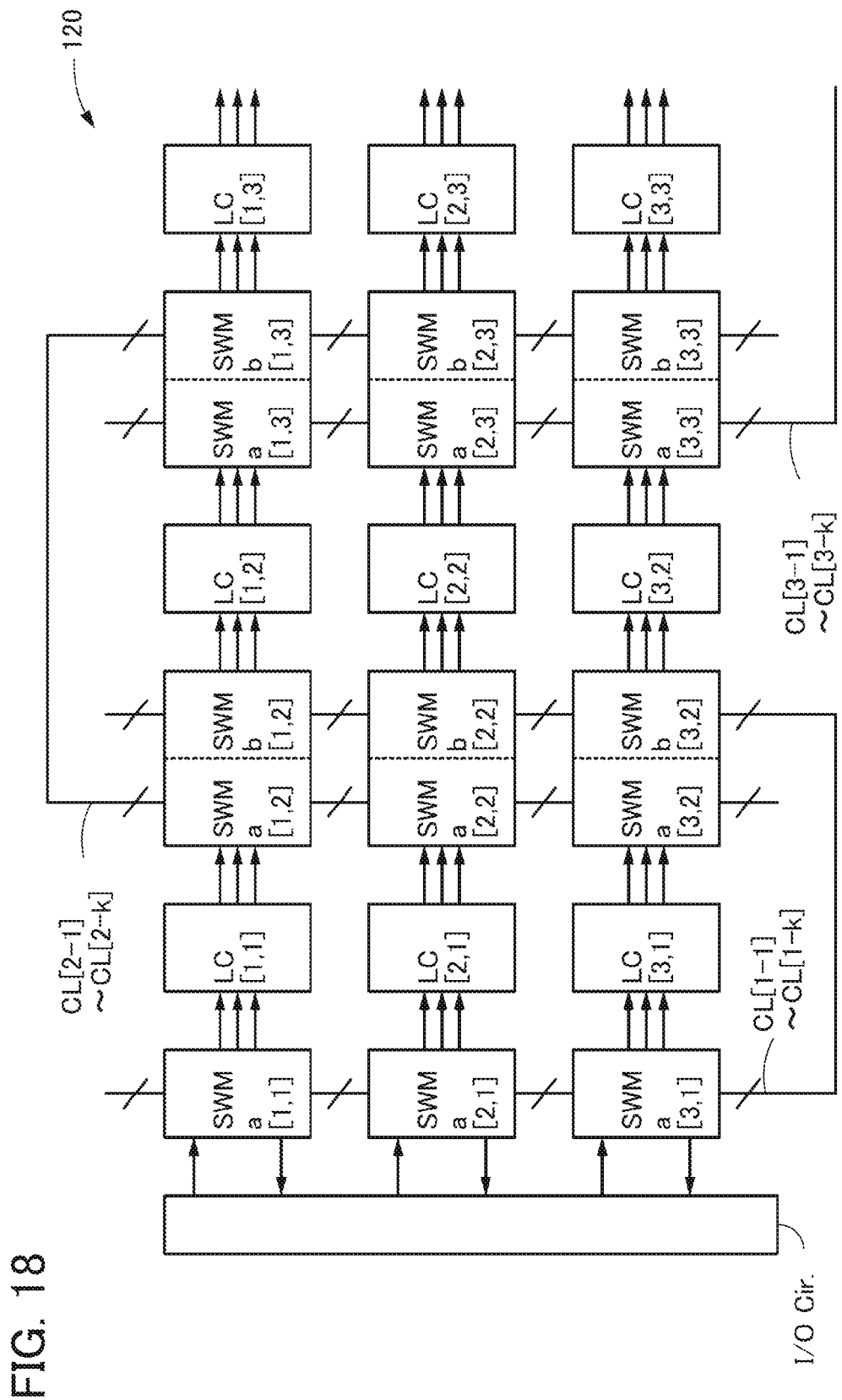
FIG. 18 illustrates a structural example of a data processing device.

For example, a data processing device 120 in FIG. 18 includes a matrix formed of switch array matrixes SWMa, switch array matrixes SWMb, and the logic circuits LC similar to those in FIG. 2, FIGS. 3A and 3B, FIG. 4, FIGS. 5A to 5C, and FIGS. 6A to 6C, but has a configuration different from that of the data processing device 100 in FIG. 1. However, one of the switch array matrix SWMa and the switch array matrix SWMb can be used as a data memory or a tag memory.

(Embodiment 2)

In this embodiment, an example of a processor including a reconfigurable circuit is described. There are a variety of verification methods of a processor (chip test), and a built-in self-test (BIST) is known as one example. In a BIST, a dedicated test circuit for generating a test pattern used in a chip test is incorporated in a processor, so that a high-speed chip test is possible compared with the case where a test pattern is supplied from the outside of a processor.

The dedicated test circuit incorporated in the processor generates only a pattern determined in a design phase. Therefore, in order to perform an additional chip test, a corresponding test pattern needs to be supplied from the outside of the processor. Furthermore, the test circuit is not needed after the chip test. Accordingly, providing a large test circuit to perform a sophisticated chip test results in an increase in manufacturing cost of a processor.

In this embodiment, an example of a processor is described in which a chip test is performed with a test circuit formed using a reconfigurable circuit and the reconfigurable circuit can be used to form a memory (e.g., a cache memory) when a chip test is not performed.

A cache memory is a high-speed memory which copies part of the contents of a memory outside a processor (external memory) and stores it in the processor. When the processor accesses an external memory, an operation of the processor is delayed due to transmission distance and low processing speed of the external memory.

Note that the case where data a processor requires is in a cache memory is called a cache hit, and the case where data a processor requires is not in a cache memory is called a cache miss. In the case of a cache miss, data is taken in from an external memory, so that access to the external memory is required, interfering with an operation of the processor. Therefore, the processor can execute processing at higher speed as the probability of cache hit (cache hit rate) is higher, i.e., as the probability of cache miss (cache miss rate) is lower. An increase in the capacity of a cache memory is effective in improvement of performance of a processor.

Figure 19A:
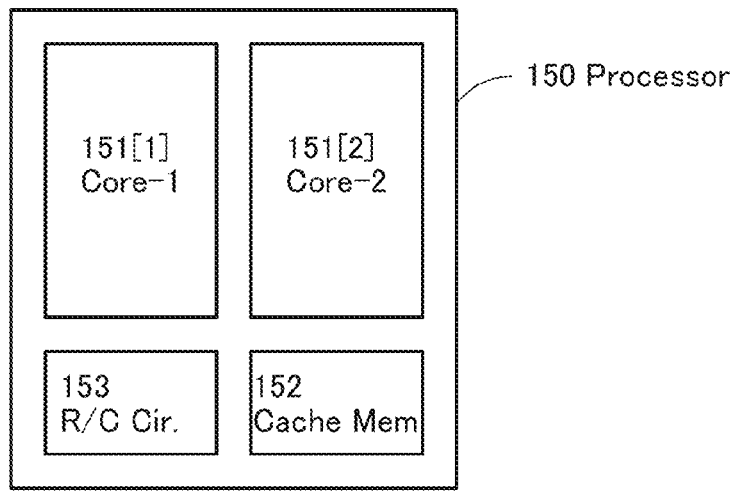
FIGS. 19A to 19C illustrate a structural example and operation examples of a data processing device.

As illustrated in FIG. 19A, a processor 150 includes arithmetic circuits (a core 151[1] and a core 151[2]), a cache memory 152, and a reconfigurable circuit 153. Note that the processor 150 may include an additional circuit. The data processing device 100 described in Embodiment 1 can be used as the reconfigurable circuit 153. Without limited thereto, any reconfigurable circuit can be used as long as the programmable switch PSW can be used as a memory cell. Each of the cores 151[1] and 151[2] may include its own cache memory.

Figure 19B:
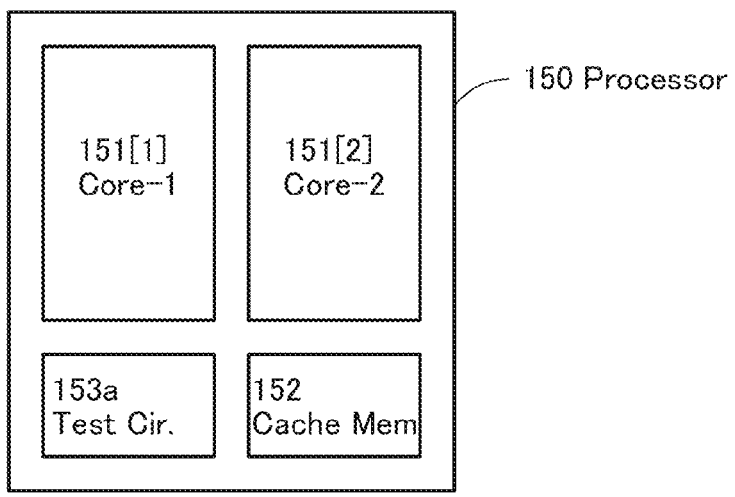

First, FIG. 19B illustrates the case of performing a chip test. Here, part or the whole of the reconfigurable circuit 153 is reconfigured as a test circuit 153a and test signals are sent to the cores 151[1] and 151[2] from the test circuit 153a; thus, the chip test is performed. The test circuit 153a may have a function of examining operation states of the cores 151[1]1 and 151[2]. The reconfigurable circuit 153 performs the chip test in the drive mode described in Embodiment 1.

Before the chip test, data for reconfiguring the reconfigurable circuit 153 as the test circuit 153a is supplied to the reconfigurable circuit 153 from the outside of the processor 150 and written in the switch array matrixes SWM and the logic circuits LC in the reconfigurable circuit 153. This can be performed in the manner described in [Data writing] in Embodiment 1.

Furthermore, a test pattern generated by the test circuit 153a is not limited to a signal for testing the cores 151[1] and 151[2], and may be a signal for testing an operation state of another circuit in the processor 150 or a signal for testing an operation state of the whole processor 150. For example, the test circuit 153a can generate a test pattern for testing an operation state of part of a circuit in the core 151[1] and the cache memory 152. For another example, in the case where the processor 150 includes an analog circuit, the test circuit 153a can generate a test pattern for testing an operation state of the analog circuit.

For example, in the chip test, communication of a signal between the test circuit 153a and the cores 151[1] and 151[2] (or another circuit) is performed through the input/output circuit in FIG. 1.

Figure 19C:
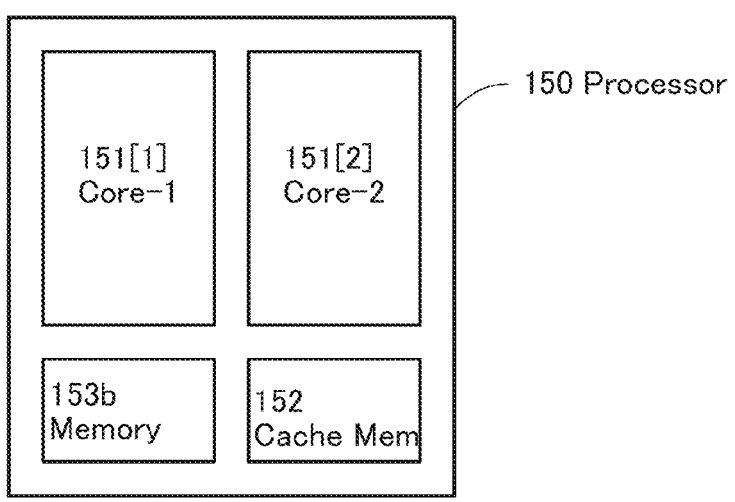

FIG. 19C illustrates the case where the chip test is not performed. Here, the reconfigurable circuit 153 is in the memory mode described in Embodiment 1 and part or the whole thereof is used as a memory 153b. The memory 153b functions as a cache memory. As a result, the capacity of the cache memory can be increased, resulting in an increase in the cache hit rate. In the case where the reconfigurable circuit 153 is used as a cache memory, for example, each row of the switch array matrix SWM in FIG. 11 corresponds to a cache memory line and the programmable switch PSW corresponds to either a data field or a tag field.

In this case, communication of a signal between the memory 153b and the cores 151[1] and 151[2] (or another circuit) is performed through the driver BL_Driver, the driver CL_Driver, the driver WWL_Driver, or the driver CWL_Driver in FIG. 9 (or FIG. 10), or the like. Furthermore, high impedance is provided between the input/output circuit and the switch array matrix SWM in FIG. 1, whereby communication of a signal between the memory 153b and the cores 151[1] and 151[2] (or another circuit) through the input/output circuit is made impossible.

As an example, in the processor 150, the memory 153b can function as a set associative cache memory together with the cache memory 152. For example, when an operation state of the processor 150 is tested, the memory 152 functions as an n-way set associative cache memory (n is a natural number of 2 or more), and in a normal operation, the cache memory 152 and the cache memory 153b can function as an (n+m)-way set associative cache memory (m is a natural number).

Note that the state where the reconfigurable circuit 153 is reconfigured as the test circuit 153a and the chip test is performed, the state where the reconfigurable circuit 153 after chip test is reconfigured as the memory 153b, and the like can be switched in response to an instruction input to the processor 150. Alternatively, an instruction to switch the operation states may be stored in the processor 150 and the operation states may be automatically switched when power is supplied to the processor 150.

In a normal operation of the processor 150, data used for a logical operation performed in the processor 150, data obtained from the logical operation performed in the processor 150, an instruction conducted in the processor 150, and the like can be stored in the memory 153$b$ (i.e., the reconfigurable circuit 153). In other words, the reconfigurable circuit 153 can be used not only in testing the operation state of (part or the whole of) the processor 150 but also in the normal operation of the processor 150, so that the circuit can be efficiently used.

Note that the reconfigurable circuit 153 may become a direct or indirect subject of the test. For example, in the case where the reconfigurable circuit 153 is reconfigured as the cache memory in FIG. 19C, the core 151[1] transmits a signal to the reconfigurable circuit 153 in testing the core 151[1] on the assumption that the reconfigurable circuit 153 is a cache memory. However, the reconfigurable circuit 153 functions as the test circuit 153$a$ in the test, and the reconfigurable circuit 153 probably cannot respond properly as the cache memory (e.g., data cannot be written or read). In this case, an error occurs although the core 151[1] functions normally.

In order to prevent such a case, a signal indicating that a valid bit of the reconfigurable circuit 153 (or a portion corresponding to part or the whole of the cache memory in the memory mode) is ineffective may be sent in the chip test. At this time, an output of data of the reconfigurable circuit 153 can have a given value, so that the core 151[1] regards this portion as a memory outputting ineffective data and operations of other portions are not influenced.

With such a structure, a test pattern can be changed easily even after manufacture of a chip, and the capacity (the number of sets) of a cache memory after a chip test can be increased. Thus, the cache hit rate and the performance of the processor can be improved.

(Embodiment 3)

In this embodiment, another example of a processor including a reconfigurable circuit is described. At the time when a processor starts operating, a program called a startup routine is executed first for the purpose of setting values of various control registers. The startup routine is generally stored in a memory such as a ROM apart from the processor, and is sent to the processor from the ROM when power is supplied to the processor.

The startup routine needs to be held even when power is not supplied to the processor, so that the startup routine needs to be stored in a nonvolatile memory. Furthermore, when a memory storing the startup routine is apart from the processor, it takes long time to transmit the startup routine, so that it takes time for the processor to start up.

When a nonvolatile memory storing a startup routine is incorporated in a processor, the time required for starting the processor can be shortened. Note that the startup routine is often a program which is executed in starting the processor and does not need to be executed again in the normal operation. Therefore, a nonvolatile memory storing a startup routine is a circuit which is not needed in the normal operation of the processor, and incorporating the nonvolatile memory increases chip cost of the processor.

In this embodiment, a reconfigurable circuit is provided in a processor, a startup routine is stored in the reconfigurable circuit when power is not supplied to the processor, the processor starts up by using the stored startup routine after power is supplied to the processor, the reconfigurable circuit is used as part of a cache memory as described in Embodiment 2 after starting the processor, and the startup routine is transferred to the reconfigurable circuit from a ROM in the operation of the processor or before stop of power supply to the processor.

As described above, the startup routine needs to be held even in the state where power supply to the processor is stopped, so that a transistor including an oxide semiconductor and having extremely small off-state current is preferably used as the transistor 101 of the programmable switch PSW in FIG. 3A, for example.

Figure 20A:
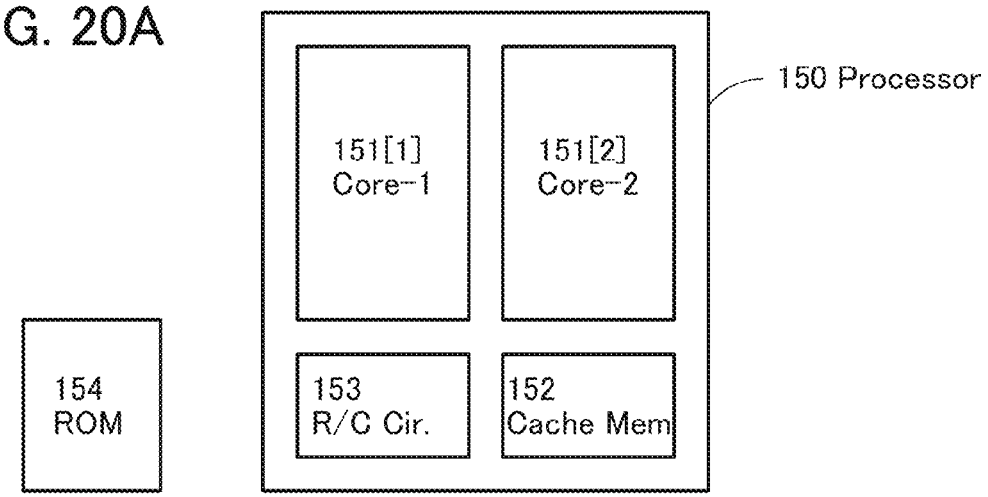
FIGS. 20A to 20C illustrate a structural example and operation examples of a data processing device.

As illustrated in FIG. 20A, the processor 150 includes, like the one described in Embodiment 2, the cores 151[1] and 151[2], the cache memory 152 the cores use, and the reconfigurable circuit 153. Furthermore, a ROM 154 storing a startup routine exists apart from the processor 150.

Before power is supplied to the processor 150, the reconfigurable circuit 153 functions as the memory 153$b$ operating in the memory mode. A startup routine is stored in the memory 153$b$. For example, the startup routine is stored after the test of the processor described in Embodiment 2, before stop of power supply to the processor, or during operation of the processor. Since the startup routine is a relatively small program, an address in which the startup routine is stored is preferably determined in advance. Note that in the case where the processor stops abnormally (e.g., the case where the processor cannot terminate an operation normally due to power failure), the startup routine is not stored in the memory 153$b$ in some cases.

Figure 20B:
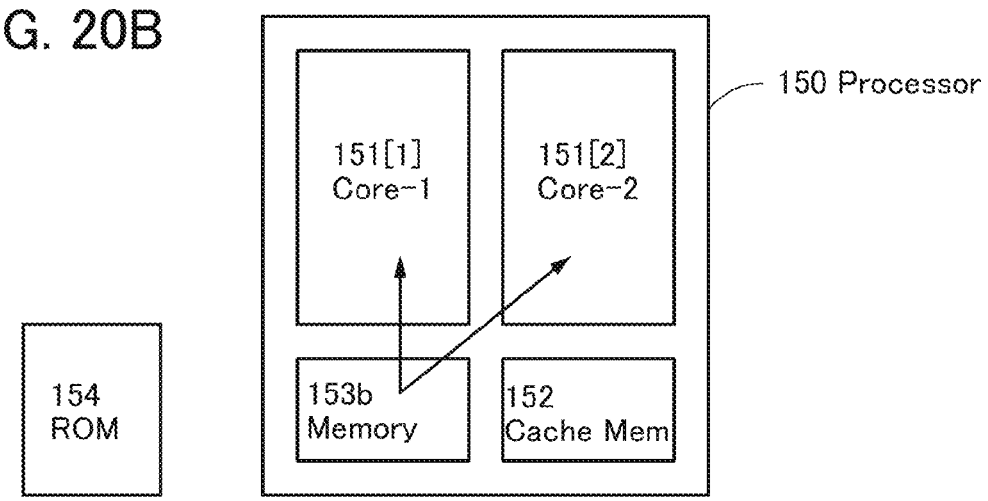

In the case where power is supplied to the processor 150 and the startup routine is stored in the memory 153$b$, as illustrated in FIG. 20B, the cores 151[1] and 151[2] are activated using the startup routine stored in the memory 153$b$. In the case where the startup routine is not stored in the memory 153$b$, a startup routine is loaded from the ROM 154 for activation, so that it takes longer time.

After the processor starts up, the memory 153$b$ functions as a cache memory. The startup routine stored originally might be overwritten with another data. Even in the case of using the memory 153$b$ as a cache memory, it is preferable that data not be written in an address where the startup routine is to be stored if possible.

Figure 20C:
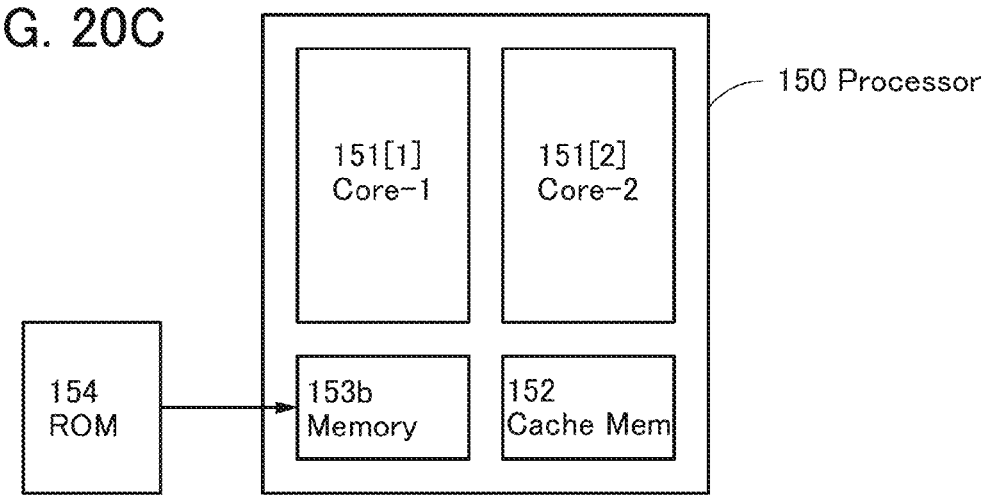

In the case where the processor 150 is operating, an address of the memory 153$b$ where the startup routine is to be stored is vacant, and a load of the processor 150 is small, the startup routine may be loaded from the ROM at a predetermined timing to be written in the specified address as illustrated in FIG. 20C. Even in the case of abnormal stop after that, the processor 150 can start up again at high speed since the startup routine is stored in the memory 153$b$, unless another data is overwritten in the address.

Depending on the operation of the processor 150 after that, another data might be written in an address where the startup routine is to be stored. In the case where the processor 150 abnormally stops in such a state, the startup routine is not stored in the memory 153$b$; therefore, the startup routine needs to be loaded from the ROM 154 at the next start of the processor 150.

In the case where power supply to the processor 150 is stopped and startup processing of the processor 150 is required at resupply of power, almost all data stored in the memory 153$b$ becomes unnecessary after stop of power supply. Accordingly, the startup routine can be loaded from the ROM before stop of power supply to be written in the memory 153$b$. Note that this operation is not needed when the startup routine has been already written in the specified address.

Thus, the reconfigurable circuit 153 mounted on the processor 150 can be used as a nonvolatile memory storing a startup routine just after start of power supply to the processor 150, and can also be used as a cache memory in the normal operation, leading to improvement in performance of the processor 150.

(Embodiment 4)

In this embodiment, specific device structures of the data processing device 100, the processor 150, and the like described in Embodiments 1 to 3 which are formed using a semiconductor device including an oxide semiconductor transistor (OS transistor) and a single-crystal silicon transistor (Si transistor) will be described.

<Device Structure>

FIG. 21A is a cross-sectional view of an example of a device structure of a semiconductor device including an OS transistor and a Si transistor. In FIG. 21A, the data processing device 100 is shown as such a semiconductor device. Note that FIG. 21A is not a cross-sectional view of the data processing device 100 taken along a specific cutting-plane line but a view for showing a stacked structure of the data processing device 100. FIG. 21A typically illustrates the transistor 101, the transistor 102, the transistor 103, and the capacitor 104 all included in the programmable switch PSW of the data processing device 100. The transistors 102 and 103 are n-channel Si transistors. The transistor 101 and the capacitor 104 are stacked over the transistors 102 and 103.

The data processing device 100 is formed using a semiconductor substrate. A bulk single-crystal silicon wafer 200 is used as the semiconductor substrate. Note that the substrate of the data processing device 100 is not limited to the bulk single-crystal silicon wafer but can be any of a variety of semiconductor substrates. For example, an SOI semiconductor substrate including a single-crystal silicon layer may be used.

The transistors 102 and 103 can be formed over the single-crystal silicon wafer 200 by a CMOS process, together with other p-channel transistors (not illustrated). An insulating layer 210 electrically isolates these transistors from one another. An insulating layer 211 is formed so as to cover the transistors 102 and 103. Conductors 231 to 233 are formed over the insulating layer 211. Conductors 221 to 223 are formed in openings formed in the insulating layer 211. Note that one of the conductors 231 and 232 may be the wiring CL, and the other may be the wiring RL.

One or more wiring layers are formed over the transistors 102 and 103 by the back end of the line (BEOL) process. Insulating layers 212 to 214 and conductors 241 to 245, 251 to 256, and 261 to 265 form a three-layered wiring structure.

An insulating layer 276 is formed to cover these wiring layers. The transistor 101 and the capacitor 104 are formed over the insulating layer 276.

The transistor 101 includes an oxide semiconductor layer 271, a conductor 281, a conductor 282, and a conductor 291. The oxide semiconductor layer 271 includes a channel formation region. The conductor 291 serves as a gate electrode. The conductors 281 and 282 each serve as a source electrode or a drain electrode. The conductor 282 is connected to the gate (conductor 220) of the transistor 102 via the conductors 223, 233, and 251 to 256. Although two conductors 220 are illustrated in FIG. 21A, these are one continuous conductor.

The capacitor 104 is an MIM capacitor, including the conductor 281 and a conductor 292 as electrodes and an insulating layer 277 as a dielectric (insulating film). The insulating layer 277 also serves as an insulator included in a gate insulating layer of the transistor 101.

An insulating layer 278 is formed to cover the transistor 101 and the capacitor 104. Conductors 296 and 297 are formed over the insulating layer 278. The conductors 296 and 297 are connected to the transistor 101 and the capacitor 104, respectively, and serve as electrodes (wirings) for connecting these elements to the layered wiring structure. For example, as illustrated, the conductor 296 is connected to the conductor 261 by the conductors 262 to 265 and a conductor 284. The conductor 297 is connected to the conductor 241 by the conductors 242 to 245 and a conductor 283.

The films included in the semiconductor device (i.e., the insulating film, the semiconductor film, the oxide semiconductor film, the metal oxide film, the conductive film, and the like) can be formed by any of a sputtering method, a chemical vapor deposition (CVD) method, a vacuum evaporation method, and a pulsed laser deposition (PLD) method. A coating method or a printing method can be used. As the CVD method, a plasma-enhanced chemical vapor deposition (PECVD) method or a thermal CVD method is used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Each of the insulating layers of the data processing device 100 can be formed using one insulating film or two or more insulating films. Examples of such an insulating film include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film.

Note that in this specification, an oxynitride refers to a substance that contains more oxygen than nitrogen, and a nitride oxide refers to a substance that contains more nitrogen than oxygen.

Each of the conductors in the data processing device 100 can be formed using one conductive film or two or more conductive films. Such conductive films are metal films containing aluminum, chromium, copper, silver, gold, platinum, tantalum, nickel, titanium, molybdenum, tungsten, hafnium, vanadium, niobium, manganese, magnesium, zirconium, beryllium, and the like. Such conductive films can be an alloy film containing any of these metal elements as a component, a compound film containing any of these metal elements as a component, or a polycrystalline silicon film containing an impurity element such as phosphorus, or the like.

<Another Structural Example of Transistor>

The structures of the Si transistor and the OS transistor included in the semiconductor device are not limited to those in FIG. 21A. For example, the OS transistor may include a back gate. In that case, an insulating layer and a conductor that constitutes a back gate over the insulating layer may be formed between the conductors 245, 256, and 265 and the conductors 281 to 284.

Alternatively, the OS transistor can have a structure as illustrated in FIG. 21B. In FIG. 21B, the transistor 101 further includes an oxide semiconductor layer 273. A channel formation region is formed in the oxide semiconductor layer 271 also in the transistor 101 of FIG. 21B.

To form the transistor 101 of FIG. 21B, the conductors 281 and 282 are formed and then an oxide semiconductor film for the oxide semiconductor layer 273, an insulating film for the insulating layer 277, and a conductive film for the conductor 291 are stacked. These stacked films are etched using a resist mask for etching the conductive film, and the oxide semiconductor layer 273 and the conductor 291 are formed. Here, a region of the insulating layer 277 which is not covered with the conductor 292 is removed in the capacitor 104.

For example, in the transistor 101 in FIG. 21A, the oxide semiconductor layer 271 is formed of two layers of oxide semiconductor films having different constituent elements. In this case, the lower layer is formed using an In—Zn-based oxide film and the upper layer is formed using an In—Ga—Zn-based oxide film, or each of the lower layer and the upper layer may be formed using an In—Ga—Zn-based oxide film.

For example, in the case where the oxide semiconductor layer 271 is formed using two In—Ga—Zn-based oxide films, one of the films can be formed using an oxide film with an atomic ratio of In:Ga:Zn=1:1:1, 5:5:6, or 3:1:2, and the other of the films can be formed using an oxide film with an atomic ratio of In:Ga:Zn=1:3:2, 1:3:4, 1:3:6, 1:6:4, or 1:9:6.

In FIG. 21B, when the oxide semiconductor layer 271 has a two-layer structure and the oxide semiconductor layer 273 has a single-layer structure, the transistor 101 may be formed using an oxide semiconductor film with a three-layer structure. Also in this case, all or part of the three layers may be formed using oxide semiconductor films including different constituent elements, or the three layers may be formed using oxide semiconductor films including the same constituent element.

For example, in the case where each of the oxide semiconductor layers 271 and 273 is formed using an In—Ga—Zn-based oxide film, each of the lower layer of the oxide semiconductor layer 271 and the oxide semiconductor layer 273 can be formed using an oxide film with an atomic ratio of In:Ga:Zn=1:3:2, 1:3:4, 1:3:6, 1:6:4, or 1:9:6, and the upper layer of the oxide semiconductor layer 271 can be formed using an oxide film with an atomic ratio of In:Ga:Zn=1:1:1, 5:5:6, or 3:1:2.

Figure 22:
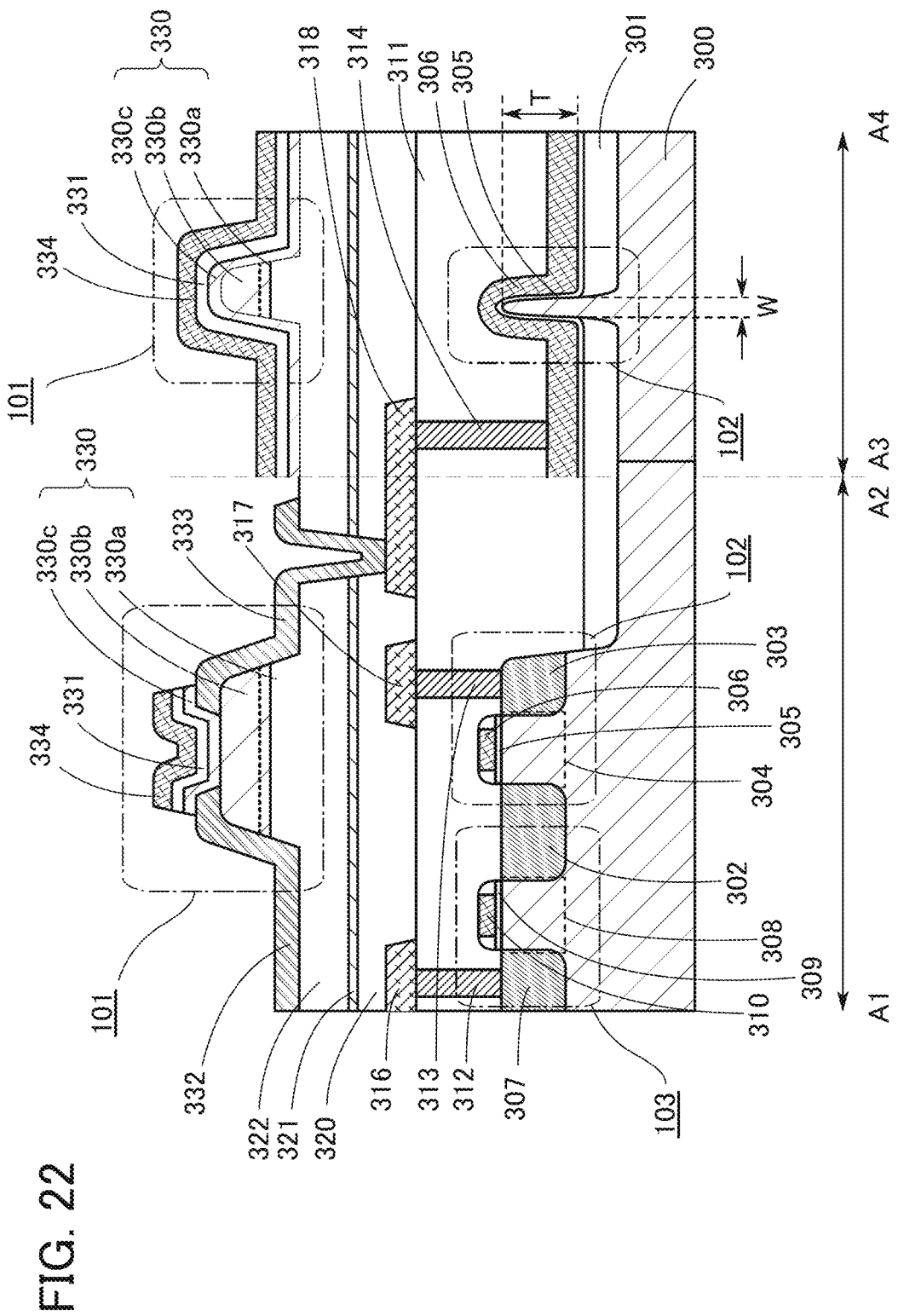
FIG. 22 illustrates an example of a cross-sectional structure of a data processing device.

FIG. 22 illustrates another structural example of a Si transistor and an OS transistor.

FIG. 22 is a cross-sectional view showing a structural example of a Si transistor and an OS transistor. In FIG. 22, the cross section A1-A2 shows the transistors 102 and 103 that are Si transistors and the transistor 101 that is an OS transistor in the channel length direction (the direction from the source to the drain), and the cross section A3-A4 shows these transistors in the channel width direction (the direction perpendicular to the channel length direction). Note that in the layout, the channel length direction of the transistor 101 does not necessarily agree with that of the transistor 102 (transistor 103).

In FIG. 22, the transistor 101 that is an OS transistor including a channel formation region in an oxide semiconductor film is formed over the transistors 102 and 103 each including a single-crystal silicon channel formation region. A single-crystal silicon substrate is used as a substrate 300 in FIG. 22.

The transistor 102 (transistor 103) is electrically isolated from other semiconductor elements by an element isolation method. As the element isolation method, a trench isolation method (a shallow trench isolation (STI) method) or the like is used. FIG. 22 illustrates an example where the trench isolation method is used to electrically isolate the transistor 102 (and the transistor 103). FIG. 22 shows an example in which the transistors 102 and 103 are isolated using an element isolation region 301. The element isolation region 301 is formed in the following manner: a trench which is formed in the substrate 300 by etching or the like is filled with an insulator including silicon oxide or the like, and then, the insulator is partially removed by etching or the like.

In a projection portion in a region other than the trench of the substrate 300, an impurity region 302, an impurity region 303, an impurity region 307, a channel formation region 304 between the impurity regions 302 and 303, and a channel formation region 308 between the impurity regions 302 and 307 of the transistors 102 and 103 are formed. The transistor 102 includes an insulating layer 305 covering the channel formation region 304 and a gate electrode 306 that overlaps with the channel formation region 304 with the insulating layer 305 placed therebetween. The transistor 103 includes an insulating layer 309 covering the channel formation region 308 and a gate electrode 310 that overlaps with the channel formation region 308 with the insulating layer 309 placed therebetween.

In the transistor 102, a side portion and an upper portion of the projection in the channel formation region 304 overlap with the gate electrode 306 with the insulating layer 305 positioned therebetween, so that carriers flow in a wide area including a side portion and an upper portion of the channel formation region 304. Thus, the amounts of transfer of carriers in the transistors 102 and 103 can be increased with the areas of the transistor 102 and 103 in the substrate kept small. As a result, the on-state current of the transistor 102 is increased and the field-effect mobility is increased.

Suppose the length of the projection of the channel formation region 304 in the channel width direction (i.e., channel width) is W and the thickness of the projection of the channel formation region 304 is T. When the aspect ratio that corresponds to the ratio of the thickness T to the channel width W is high, a region where carrier flows becomes wider. Thus, the on-state current of the transistor 102 is further increased and the field-effect mobility of the transistor 103 is further increased. The same applies to the transistor 103.

Note that when the transistors 102 and 103 are formed using a bulk semiconductor substrate, the aspect ratio is desirably 0.5 or more, further desirably 1 or more.

An insulating layer 311 is provided over the transistors 102 and 103. Openings are formed in the insulating layer 311. A conductor 313, a conductor 312, and a conductor 314 that are electrically connected to the impurity region 303, the impurity region 307, and the gate electrode 306, respectively, are formed in the openings. The conductor 312 is electrically connected to a conductor 316 over the insulating layer 311. The conductor 313 is electrically connected to a conductor 317 over the insulating layer 311. The conductor 314 is electrically connected to a conductor 318 over the insulating layer 311.

An insulating layer 320 is provided over the conductors 316 to 318. An insulating layer 321 having an effect of blocking diffusion of oxygen, hydrogen, and water is provided over the insulating layer 320. An insulating layer 322 is provided over the insulating layer 321. The transistor 101 is provided over the insulating layer 322.

As the insulating layer 321 has higher density and becomes denser or has a fewer dangling bonds and becomes more chemically stable, the insulating layer 321 has a higher blocking effect. The insulating layer 321 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating layer 321 having an effect of blocking diffusion of hydrogen and water can be formed using silicon nitride or silicon nitride oxide, for example.

The transistor 101 includes an oxide semiconductor layer 330, conductors 332 and 333 in contact with the oxide semiconductor layer 330, an insulating layer 331 covering the oxide semiconductor layer 330, and a gate electrode 334 that overlaps with the oxide semiconductor layer 330 with the insulating layer 331 placed therebetween. The conductors 332 and 333 function as source and drain electrodes. The conductor 333 is connected to the conductor 318 in an opening formed in the insulating layers 320 to 322.

Note that an insulating layer may be provided over the transistor 101. In this case, it is possible that an opening is formed in the insulating layer and a conductor that is in contact with the gate electrode 334 in the opening is provided over the insulating layer.

Note that in FIG. 22, the transistor 101 includes the gate electrode 334 on at least one side of the oxide semiconductor layer 330. The transistor 101 may also include a gate electrode that overlaps with the oxide semiconductor layer 330 with the insulating layer 322 placed therebetween.

When the transistor 101 includes a pair of gate electrodes, one of the gate electrodes may be supplied with a signal for controlling the on/off state, and the other of the gate electrodes may be supplied with another potential independently of the one of the gate electrodes. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 22, the transistor 101 has a single-channel structure where one channel formation region corresponding to one gate electrode 334 is provided. When a plurality of gate electrodes electrically connected to each other are provided in the transistor 101, for example, the transistor 101 can have a multi-channel structure where a plurality of channel formation regions are included in one oxide semiconductor layer.

FIG. 22 is an example in which the oxide semiconductor layer 330 of the transistor 101 has a three-layered structure of oxide semiconductor layers 330a to 330c. After the oxide semiconductor layers 330a and 330b are formed, the conductors 332 and 333 are formed, and then the oxide semiconductor layer 330c is formed. Note that one or two of the oxide semiconductor layers 330a to 330c may be omitted.

(Embodiment 5)

In this embodiment, the oxide semiconductor used in the OS transistor will be described.

The channel formation region of the OS transistor is preferably formed using a highly purified oxide semiconductor (purified OS). A purified OS refers to an oxide semiconductor obtained by reduction of impurities such as moisture or hydrogen that serve as electron donors (donors) and reduction of oxygen vacancies. By highly purifying an oxide semiconductor in this manner, the conductivity type of the oxide semiconductor can be intrinsic or substantially intrinsic. The term "substantially intrinsic" means that the carrier density of an oxide semiconductor is higher than or equal to $1\times10^{-9}/cm^3$ and lower than $1\times10^{17}/cm^3$. The carrier density is preferably lower than $1\times10^{15}/cm^3$, more preferably lower than $1\times10^{13}/cm^3$, particularly preferably lower than $8\times10^{11}/cm^3$, still more preferably lower than $1\times10^{11}/cm^3$, and ultimately preferably lower than $1\times10^{10}/cm^3$.

By forming the channel formation region using a purified OS, the normalized off-state current of the OS transistor can be as low as several yoctoamperes per micrometer to several zeptoamperes per micrometer at room temperature.

In the oxide semiconductor, hydrogen, nitrogen, carbon, silicon, and metal elements that are not main components are impurities. For example, hydrogen and nitrogen form donor levels to increase the carrier density. Silicon forms impurity levels in the oxide semiconductor. The impurity levels become traps, which might degrade the electrical characteristics of the OS transistor. It is preferable to reduce the concentration of the impurities in the oxide semiconductor and at an interface with another layer.

To make the oxide semiconductor intrinsic or substantially intrinsic, the oxide semiconductor is preferably highly purified to approximately any of the following impurity concentration levels. The following impurity concentrations are obtained by secondary ion mass spectrometry (SIMS) analysis at a certain depth of an oxide semiconductor layer or in a certain region of the oxide semiconductor. The purified OS has any of the following impurity concentration levels.

For example, in the case where the impurity includes silicon, the concentration of silicon is lower than $1\times10^{19}$ atoms/$cm^3$, preferably lower than $5\times10^{18}$ atoms/$cm^3$, further preferably lower than $1\times10^{18}$ atoms/$cm^3$.

For example, in the case where the impurity includes hydrogen, the concentration of hydrogen is lower than or equal to $2\times10^{20}$ atoms/$cm^3$, preferably lower than or equal to $5\times10^{19}$ atoms/$cm^3$, further preferably lower than or equal to $1\times10^{19}$ atoms/$cm^3$, still further preferably lower than or equal to $5\times10^{18}$ atoms/$cm^3$.

For example, in the case where the impurity includes nitrogen, the concentration of nitrogen is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

In the case where the oxide semiconductor including crystals contains silicon or carbon at high concentration, the crystallinity of the oxide semiconductor might be lowered. In order not to lower the crystallinity of the oxide semiconductor, for example, the concentration of silicon is set lower than $1\times10^{19}$ atoms/$cm^3$, preferably lower than $5\times10^{18}$ atoms/$cm^3$, further preferably lower than $1\times10^{18}$ atoms/$cm^3$. For example, the concentration of carbon is set lower than $1\times10^{19}$ atoms/$cm^3$, preferably lower than $5\times10^{18}$ atoms/$cm^3$, further preferably lower than $1\times10^{18}$ atoms/$cm^3$.

As the oxide semiconductor used for the OS transistor, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide means an oxide containing In, Ga, and Zn, and there is no limitation on the ratio of In, Ga, and Zn. The In—Ga—Zn-based oxide may contain a metal element other than In, Ga, and Zn. An oxide semiconductor having an appropriate composition may be formed in accordance with needed electrical characteristics (e.g., field-effect mobility and threshold voltage).

For example, an In—Ga—Zn-based oxide with an atomic ratio of In:Ga:Zn=1:1:1, In:Ga:Zn=1:3:2, In:Ga:Zn=3:1:2, or In:Ga:Zn=2:1:3, or an oxide whose composition is in the neighborhood of the above composition is preferably used. In this specification, the atomic ratio of the oxide semiconductor varies within a range of ±20% as an error.

For example, in the case where an In—Ga—Zn-based oxide is formed by sputtering, it is preferable to use an In—Ga—Zn-based oxide target with an atomic ratio of In:Ga:Zn=1:1:1, 5:5:6, 4:2:3, 3:1:2, 1:1:2, 2:1:3, 1:3:2, 1:3:4, 1:4:4, 1:6:4, or 3:1:4 as an In—Ga—Zn-based oxide deposition target. When an In—Ga—Zn-based oxide semiconductor film is deposited using such a target, a crystal part is formed in the oxide semiconductor film easily. The filling factor (relative density) of such a target is preferably higher than or equal to 90%, further preferably higher than or equal to 95%. With a target having a high filling factor, a dense oxide semiconductor film can be deposited.

For example, it is preferable to use an In—Zn-based oxide target with an atomic ratio of In:Zn=50:1 to 1:2 (a molar ratio of $In_2O_3$:ZnO=25:1 to 1:4) as an In—Zn-based oxide deposition target. The atomic ratio of In:Zn is preferably 15:1 to 1.5:1 (the molar ratio of $In_2O_3$:ZnO=3:4 to 15:2). For example, in an In—Zn-based oxide deposition target with an atomic ratio of In:Zn:O=X:Y:Z, the relation Z>1.5X+Y is preferably satisfied. The mobility of an In—Zn-based oxide film can be increased by keeping the ratio of Zn within the above range.

<Structure of Oxide Semiconductor Film>

A structure of the oxide semiconductor film is described below. In the following description, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°. Further, the trigonal and rhombohedral crystal systems are included in the hexagonal crystal system.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

<CAAC-OS Film>

First, a CAAC-OS film is described.

The CAAC-OS film is an oxide semiconductor film including a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer reflects unevenness of a surface over which the CAAC-OS film is formed (hereinafter, such a surface is referred to as a formation surface) or a top surface of the CAAC-OS film, and is arranged parallel to the formation surface or the top surface of the CAAC-OS film.

In contrast, according to the TEM image of the CAAC-OS film observed in a direction substantially perpendicular to the sample surface (plan-view TEM image), metal atoms are arranged in a triangular or hexagonal configuration in the crystal parts. However, there is no regularity of arrangement of metal atoms between different crystal parts.

FIG. 23A is a cross-sectional TEM image of a CAAC-OS film. FIG. 23B is a cross-sectional TEM image obtained by enlarging the image of FIG. 23A. In FIG. 23B, atomic arrangement is highlighted for easy understanding.

FIG. 23C is Fourier transform images of regions each surrounded by a circle (the diameter is approximately 4 nm) between A and O and between O and A' in FIG. 23A. C-axis alignment can be observed in each region in FIG. 23C. The c-axis direction between A and O is different from that between O and A', which indicates that a grain in the region between A and O is different from that between O and A'. In addition, between A and O, the angle of the c-axis continuously and gradually changes from 14.3°, 16.6°, to 30.9°. Similarly, between O and A', the angle of the c-axis continuously changes from −18.3°, −17.6°, to −11.3°.

Figure 24A:
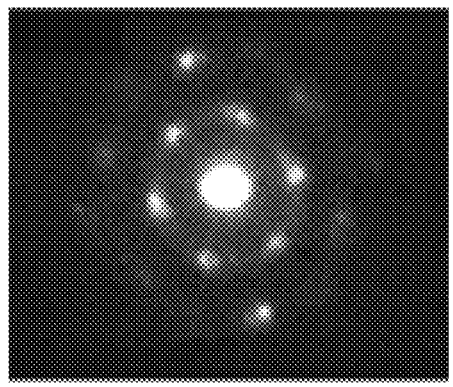
FIGS. 24A to 24D illustrate examples of structures of oxide semiconductors.

Note that in an electron diffraction pattern of the CAAC-OS film, spots (luminescent spots) having alignment are shown. For example, spots are observed in an electron diffraction pattern (also referred to as a nanobeam electron diffraction pattern) of the top surface of the CAAC-OS film which is obtained using an electron beam with a diameter of, for example, larger than or equal to 1 nm and smaller than or equal to 30 nm (see FIG. 24A).

From the results of the cross-sectional TEM image and the plan-view TEM image, alignment is found in the crystal parts in the CAAC-OS film.

Most of the crystal parts included in the CAAC-OS film each fit into a cube whose one side is less than 100 nm. Thus, there is a case where a crystal part included in the CAAC-OS film fits into a cube whose one side is less than 10 nm, less than 5 nm, or less than 3 nm. Note that when a plurality of crystal parts included in the CAAC-OS film are connected to each other, one large crystal region is formed in some cases. For example, a large crystal region with an area of larger than or equal to 2500 $nm^2$, larger than or equal to 5 $\mu m^2$, or larger than or equal to 1000 $\mu m^2$ is observed in some cases in the plan-view TEM image.

The CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2 θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of $InGaZnO_4$, six peaks appear. The six peaks are derived from crystal planes equivalent to the (110) plane. In contrast, in the case of a CAAC-OS film, a peak is not clearly observed even when φ scan is performed with 2 θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak may also be observed at 2θ of around 36°, in addition to the peak at 2θ of around 31°. The peak at 2θ of around 36° indicates that a crystal having no c-axis alignment is included in part of the CAAC-OS film. It is preferable that in the CAAC-OS film, a peak appears at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

In a transistor including the CAAC-OS film, changes in electrical characteristics of the transistor due to irradiation with visible light or ultraviolet light are small.

<Microcrystalline Oxide Semiconductor Film>

Next, a microcrystalline oxide semiconductor film is described. In an image obtained with a TEM, crystal parts cannot be found clearly in the microcrystalline oxide semiconductor film in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a crystal grain boundary cannot be found clearly in some cases.

Figure 24B:
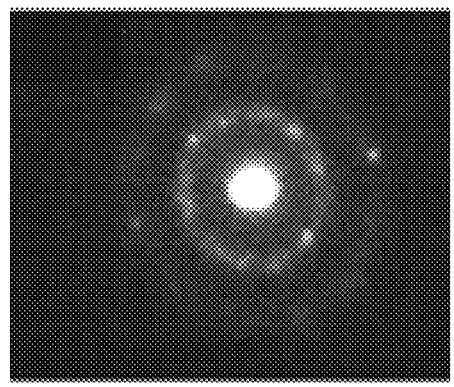

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the diameter of a crystal part, a peak that shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 24B).

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

However, even when the oxide semiconductor film is a CAAC-OS film, a diffraction pattern that is partly similar to that of an nc-OS film is observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that a proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 24C:
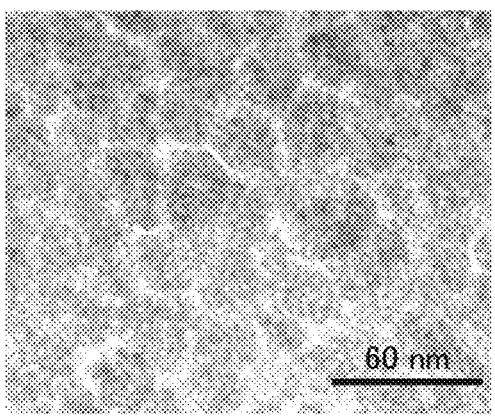
Figure 24D:
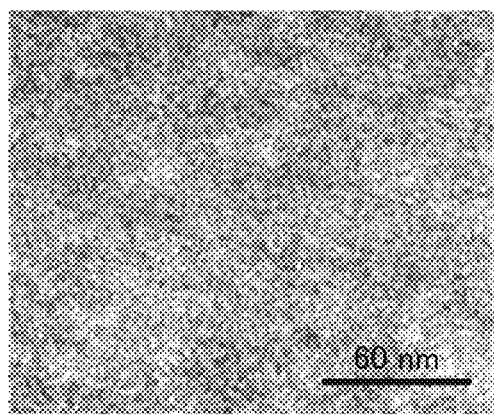

FIGS. 24C and 24D are plan-view TEM images of the CAAC-OS film obtained just after the deposition (as-sputtered) and the CAAC-OS film subjected to the heat treatment at 450° C., respectively. Comparison between FIGS. 24C and 24D shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

(Embodiment 6)

The above-described data processing devices can be used in various semiconductor devices and electronic devices. Examples of such electronic devices are personal computers and image reproducing devices provided with recording media (devices that read image data of recording media such as digital versatile discs (DVDs) and have displays for displaying images). Other examples are mobile phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 25A to 25F illustrate specific examples of these electronic devices.

Figure 25A:
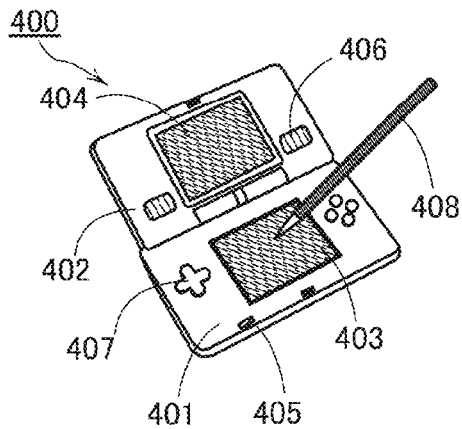
FIGS. 25A to 25F illustrate electronic devices each including a data processing device.

FIG. 25A is an external view illustrating a structural example of a portable game machine. A portable game machine 400 includes a housing 401, a housing 402, a display portion 403, a display portion 404, a microphone 405, speakers 406, an operation key 407, a stylus 408, and the like.

Figure 25B:
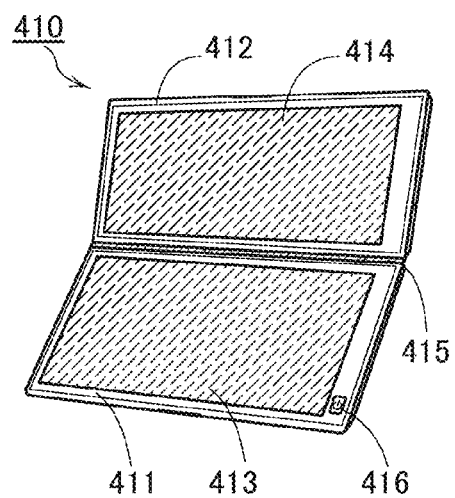

FIG. 25B is an external view illustrating a structural example of a portable information terminal. A portable information terminal 410 includes a housing 411, a housing 412, a display portion 413, a display portion 414, a joint 415, an operation key 416, and the like. The display portion 413 is provided in the housing 411, and the display portion 414 is provided in the housing 412. The housings 411 and 412 are connected to each other with the joint 415, and the angle between the housings 411 and 412 can be changed with the joint 415. Images displayed on the display portion 413 may be switched in accordance with the angle at the joint 415 between the housing 411 and the housing 412. Note that the display portion 413 and/or the display portion 414 may be touch panels.

Figure 25C:
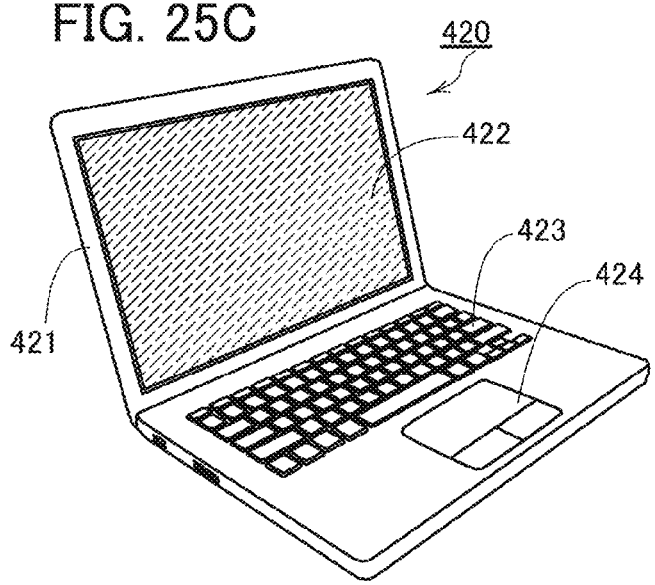

FIG. 25C is an external view illustrating a structural example of a laptop. A personal computer 420 includes a housing 421, a display portion 422, a keyboard 423, a pointing device 424, and the like.

Figure 25D:
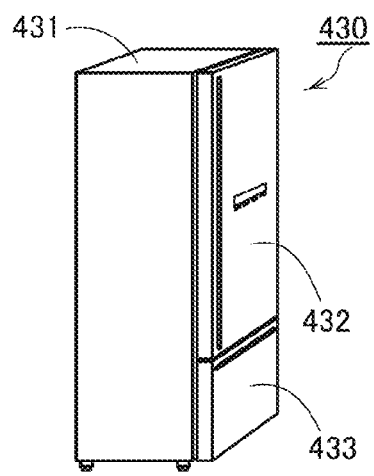

FIG. 25D is an external view illustrating a structural example of an electric refrigerator-freezer. An electric refrigerator-freezer 430 includes a housing 431, a refrigerator door 432, a freezer door 433, and the like.

Figure 25E:
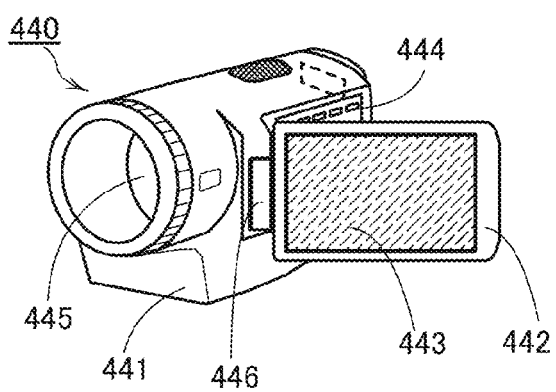

FIG. 25E is an external view illustrating a structural example of a video camera. The video camera 440 includes a housing 441, a housing 442, a display portion 443, operation keys 444, a lens 445, a joint 446, and the like. The operation keys 444 and the lens 445 are provided in the housing 441, and the display portion 443 is provided in the housing 442. The housing 441 and the housing 442 are connected to each other with the joint 446, and the angle between the housing 441 and the housing 442 can be changed with the joint 446. The direction of an image on the display portion 443 may be changed and display and non-display of an image may be switched depending on the angle between the housing 441 and the housing 442.

Figure 25F:
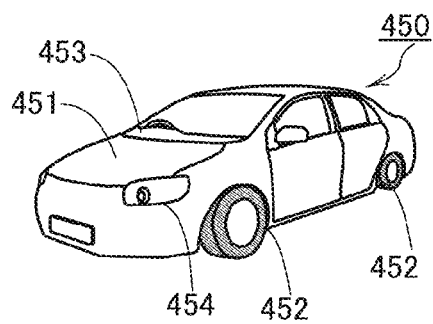

FIG. 25F is an external view illustrating a structural example of a motor vehicle. A motor vehicle 450 includes a car body 451, wheels 452, a dashboard 453, lights 454, and the like.

The data processing devices in the above embodiments can be used in a cache memory, a main memory, or a storage of various kinds of arithmetic processing unit (e.g., a CPU, a microcontroller, a programmable device such as an FPGA, and an RFID tag).

This embodiment can be implemented in appropriate combination with any of the other embodiments.

This application is based on Japanese Patent Application serial no. 2014-006354 filed with Japan Patent Office on Jan. 17, 2014, the entire contents of which are hereby incorporated by reference.

What is claimed is:

1. A semiconductor device comprising:
a reconfigurable circuit comprising a first wiring group, a second wiring group, a switch array matrix, and a logic circuit, the logic circuit comprising a switch,
wherein the switch array matrix comprises a plurality of programmable switches,
wherein signals are configured to be input to the logic circuit via a plurality of wirings of the second wiring group,
wherein an output of the logic circuit is configured to be input to the first wiring group via the switch,
wherein each of the plurality of programmable switches is configured to make an electrical connection and an electrical disconnection between one wiring of the first wiring group and one wiring of the second wiring group, and
wherein the reconfigurable circuit is configured to function as a test circuit when a test for a chip is performed, function as a nonvolatile memory storing a startup routine program when a processor starts up, and function as a memory in a normal operation.

2. The semiconductor device according to claim 1, wherein the memory is a cache memory of the processor.

3. The semiconductor device according to claim 1, wherein the switch is a tri-state buffer.

4. The semiconductor device according to claim 1, further comprising a third wiring group designed to be parallel to the first wiring group, a fourth wiring group and a fifth wiring group, both designed to be parallel to the second wiring group,
wherein each of the plurality of programmable switches comprises a first switching element, a second switching element, and a capacitor,
wherein the first switching element is configured to be on or off according to electrical charges stored in the capacitor,
wherein the second switching element is configured to be on or off according to a signal of one wiring of the fifth wiring group,
wherein each of the plurality of programmable switches is configured to make the electrical connection between the one wiring of the first wiring group and the one wiring of the second wiring group when both the first switching element and the second switching element are on,
wherein data corresponding to signals transmitted by one wiring of the third wiring group is configured to be input to each of the plurality of programmable switches as the electrical charges, and
wherein inputting the data to each of the plurality of programmable switches is configured to be controlled by signals of one wiring of the fourth wiring group.

5. The semiconductor device according to claim 4, further comprising a transistor in each of the plurality of programmable switches,
wherein an operation of the transistor is configured to be controlled by the signals of the one wiring of the fourth wiring group, and
wherein the transistor comprises a channel formation region comprising an oxide semiconductor.

6. A semiconductor device comprising:
a reconfigurable circuit comprising a first wiring group, a second wiring group, a first switch array matrix, a second switch array matrix, a third switch array matrix, and a logic circuit, the logic circuit comprising a first switch, a second switch, and a third switch,
wherein each of the first switch array matrix, the second switch array matrix, and the third switch array matrix comprises a plurality of programmable switches,
wherein each of the plurality of programmable switches is configured to make an electrical connection and an electrical disconnection between one wiring of the first wiring group and one wiring of the second wiring group,
wherein signals are configured to be input to the logic circuit via a plurality of wirings of the second wiring group,
wherein a first output of the logic circuit is configured to be input to a first group of the first wiring group via the first switch,
wherein a second output of the logic circuit is configured to be input to a second group of the first wiring group via the second switch,
wherein a third output of the logic circuit is configured to be input to a third group of the first wiring group via the third switch, and
wherein the first group of the first wiring group passes through the first switch array matrix, the second group of the first wiring group passes through the second switch array matrix, and the third group of the first wiring group passes through the third switch array matrix.

7. The semiconductor device according to claim 6,
wherein the reconfigurable circuit is configured to function as a test circuit when a test for a chip is performed, function as a nonvolatile memory storing a startup routine program when a processor starts up, and function as a memory in a normal operation.

8. The semiconductor device according to claim 7, wherein the memory is a cache memory of the processor.

9. The semiconductor device according to claim 6, wherein each of the first switch, the second switch, and the third switch is a tri-state buffer.

10. The semiconductor device according to claim 6, further comprising a third wiring group designed to be parallel to the first wiring group, a fourth wiring group and a fifth wiring group, both designed to be parallel to the second wiring group,
wherein each of the plurality of programmable switches comprises a first switching element, a second switching element, and a capacitor,
wherein the first switching element is configured to be on or off according to electrical charges stored in the capacitor,
wherein the second switching element is configured to be on or off according to a signal of one wiring of the fifth wiring group,
wherein each of the plurality of programmable switches is configured to make the electrical connection between the one wiring of the first wiring group and the one wiring of the second wiring group when both the first switching element and the second switching element are on, wherein data corresponding to signals transmitted by one wiring of the third wiring group is configured to be input to each of the plurality of programmable switches as the electrical charges, and wherein inputting the data to each of the plurality of programmable switches is configured to be controlled by signals of one wiring of the fourth wiring group.

11. The semiconductor device according to claim 10, further comprising a transistor in each of the plurality of programmable switches, wherein an operation of the transistor is configured to be controlled by the signals of the one wiring of the fourth wiring group, and wherein the transistor comprises a channel formation region comprising an oxide semiconductor.

12. A method for driving the semiconductor device according to claim 1, comprising:

reconfiguring the reconfigurable circuit as the test circuit;
performing the test by using the test circuit; and
reconfiguring the reconfigurable circuit as the memory after the test.

13. A method for driving the semiconductor device according to claim 7, comprising:

reconfiguring the reconfigurable circuit as the test circuit;
performing the test by using the test circuit; and
reconfiguring the reconfigurable circuit as the memory after the test.

14. A method for driving a semiconductor device comprising a reconfigurable circuit comprising a logic circuit, comprising:

supplying power to the reconfigurable circuit;

loading a startup routine program into a processor from the reconfigurable circuit if the startup routine program is stored in the reconfigurable circuit;

loading the startup routine program into the reconfigurable circuit from a ROM if the startup routine program is not stored in the reconfigurable circuit;

starting up the processor by using the startup routine program; and reconfiguring the reconfigurable circuit as a memory.

15. The method for driving the semiconductor device, according to claim 14, wherein the memory is a cache memory.

16. The method for driving the semiconductor device, according to claim 15, wherein the cache memory is used as a tag memory.

17. The method for driving the semiconductor device, according to claim 14, further comprising:

reconfiguring the reconfigurable circuit as a test circuit; and performing a test for a chip by using the test circuit before reconfiguring the reconfigurable circuit as the memory.

18. The method for driving the semiconductor device, according to claim 17, wherein the chip comprises the processor, and wherein the processor comprises the reconfigurable circuit.

* * * * *